(12) United States Patent
Lu

(10) Patent No.: US 11,567,276 B2
(45) Date of Patent: Jan. 31, 2023

(54) SHIELD CAGE ASSEMBLY

(71) Applicant: Molex, LLC, Lisle, IL (US)

(72) Inventor: You-Qian Lu, New Taipei (TW)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 17/143,238

(22) Filed: Jan. 7, 2021

(65) Prior Publication Data
US 2021/0132313 A1  May 6, 2021

Related U.S. Application Data

(63) Continuation of application No. 16/529,801, filed on Aug. 2, 2019, now Pat. No. 10,942,322.

(30) Foreign Application Priority Data

Aug. 2, 2018 (CN) .......................... 201810869347.8
Sep. 26, 2018 (CN) .......................... 201811125103.5

(51) Int. Cl.
  *G02B 6/42* (2006.01)
(52) U.S. Cl.
  CPC ......... *G02B 6/4269* (2013.01); *G02B 6/4277* (2013.01)
(58) Field of Classification Search
  CPC .............. G02B 6/4269; G02B 6/4277; G02B 6/0008; H05K 9/0058; H01R 13/6581
  See application file for complete search history.

(56) References Cited

U.S. PATENT DOCUMENTS

| 6,373,699 | B1 | 4/2002 | Chen |
| 7,601,021 | B1 | 10/2009 | Yang |
| 9,137,929 | B1 | 9/2015 | Yang |
| 9,739,959 | B2 | 8/2017 | Masahiko et al. |
| 9,793,648 | B2 | 10/2017 | Regnier et al. |

(Continued)

FOREIGN PATENT DOCUMENTS

| CN | 2450707 Y | 9/2001 |
| CN | 2664345 Y | 12/2004 |

(Continued)

OTHER PUBLICATIONS

Office Action received for CN Application No. 201811125103.5, dated Nov. 3, 2020, 18 Pages. (9 Pages of English Translation and 9 pages of Official notice).

(Continued)

*Primary Examiner* — John Bedtelyon

(57) ABSTRACT

A shield cage assembly of the present disclosure comprises a metal shield shell and a heat dissipating module. The metal shield shell comprises a plurality of walls and an accommodating space defined by the plurality of walls, and the accommodating space has a front end port. The heat dissipating module is assembled to one of the walls of the metal shield shell, and the metal shield shell further includes side walls respectively positioned at two sides of the wall to which the heat dissipating module is assembled. The heat dissipating module further includes a frame and a first heat dissipating member, the frame having a frame body formed at a central portion of the frame to receive the first heat dissipating member and two side plates which extend from two side edges of the frame and which are parallel to the side walls.

20 Claims, 40 Drawing Sheets

(56) References Cited

U.S. PATENT DOCUMENTS

| | | | |
|---|---|---|---|
| 10,306,806 B2 * | 5/2019 | Hall, III | G02B 6/428 |
| 10,321,607 B2 | 6/2019 | Ito et al. | |
| 10,555,437 B2 | 2/2020 | Little | |
| 10,588,243 B2 | 3/2020 | Little et al. | |
| 10,782,492 B2 | 9/2020 | Meunier et al. | |
| 2003/0161108 A1 | 8/2003 | Bright et al. | |
| 2007/0183128 A1 | 8/2007 | Pirillis et al. | |
| 2009/0109627 A1 | 4/2009 | Murr et al. | |
| 2019/0296493 A1 | 9/2019 | Liu et al. | |

FOREIGN PATENT DOCUMENTS

| | | | |
|---|---|---|---|
| CN | 101076237 A | 11/2007 | |
| CN | 201360070 Y | 12/2009 | |
| CN | 201490183 U | 5/2010 | |
| CN | 202167680 U | 3/2012 | |
| CN | 204168691 U | 2/2015 | |
| CN | 103094764 B | 5/2015 | |
| CN | 104756621 A | 7/2015 | |
| CN | 204498556 U | 7/2015 | |
| CN | 204597156 U | 8/2015 | |
| CN | 205863499 U | 1/2017 | |
| CN | 106532372 A | 3/2017 | |
| CN | 206282003 U | 6/2017 | |
| CN | 106990488 A | 7/2017 | |
| CN | 107113994 A | 8/2017 | |
| CN | 206421056 U | 8/2017 | |
| CN | 206993592 U | 2/2018 | |
| GB | 2378823 A | 2/2003 | |
| TW | M317676 U | 8/2007 | |
| TW | M528537 U | 9/2016 | |
| TW | 201729471 A | 8/2017 | |

OTHER PUBLICATIONS

Office Action received for Chinese Application No. 202010869944.8, dated Aug. 16, 2022, 11 pages (6 pages of English Translation and 5 pages of official notification).

* cited by examiner

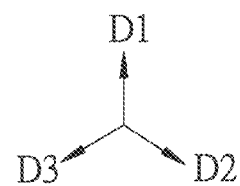
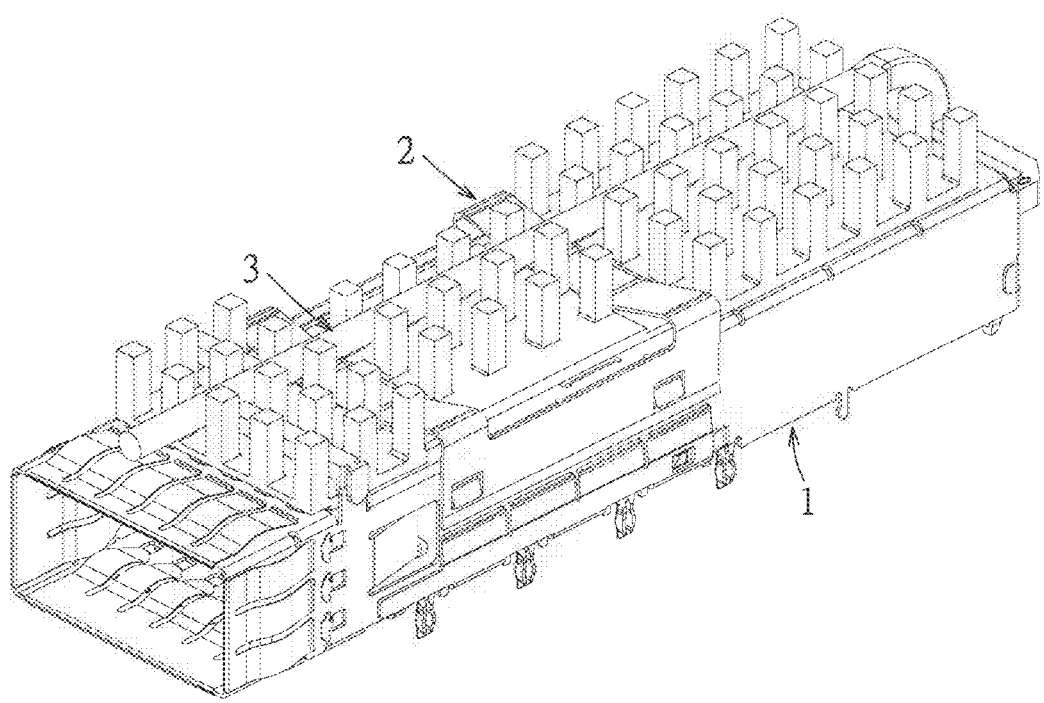
FIG. 30

SHIELD CAGE ASSEMBLY

RELATED APPLICATIONS CLAIMING PRIORITY

This application is a continuation of U.S. application Ser. No. 16/529,801 filed on Aug. 2, 2019 which claims priority to Chinese application No. 201810869347.8, filed Aug. 2, 2018 and Chinese application No. 201811125103.5, filed Sep. 26, 2018, all of which are incorporated herein by reference in their entirety.

FIELD OF THE PRESENT DISCLOSURE

The present disclosure relates to a shield cage assembly, particularly relates to a shield cage assembly having a heat dissipating structure and a light guide structure.

BACKGROUND OF THE PRESENT DISCLOSURE

Chinese Utility Model Patent application issuance Publication No. CN2450707Y (corresponding to U.S. Pat. No. 6,373,699) discloses a heat dissipating device, which discloses a clip accommodated in a penetrating groove of the fin body and closely attached to the top surface of the base, this solution is the heat dissipating structure applied in the field of wafers. In the field of high-speed connectors with a metal shield shell, it is necessary to conceive different configurations and to create a heat dissipating effect with higher heat dissipating efficiency under the basic structure of this field.

Chinese Utility Model Patent application issuance Publication No. CN103094764B (corresponding to U.S. Pat. No. 9,793,648) discloses a connector in which fins are provided on a heat transfer plate. Chinese Utility Model Patent application issuance Publication No. CN205863499U discloses an electrical connector in which a heat pipe is fixed under the heat dissipating sheet. However, the heat dissipating configuration of the above two prior arts are only limited within the metal shield shell or the connector, so that the heat dissipating effect is limited.

Chinese Utility Model Patent Application No. CN200920006325.5 (corresponding to U.S. Pat. No. 7,601,021) discloses a connector assembly, which discloses that the two sides of the heat-sink clip each have a recessed groove, and the light guide column has a cylinder body at the position corresponding to the recessed groove to be sleeved into the recessed groove, and the plate surface direction of the recessed groove is a direction facing the front-rear direction, therefore the recessed groove will block the air flow flowing in the front-rear direction, thereby affecting the heat dissipating efficiency.

Chinese Utility Model Patent Application No. CN201120303406.9 discloses a connector in which the tab used for fixing the light guide column is provided on the upper bottom plate (the top wall of the shell), and the plate surface direction of the tabs is a direction facing the front-rear direction, therefore the tab will block the air flow flowing in the front-rear direction, thereby affecting the heat dissipating efficiency.

SUMMARY OF THE PRESENT DISCLOSURE

Therefore, an object of the present disclosure is to provide a shield cage assembly which can overcome at least one of the deficiencies of the above prior arts.

Accordingly, in some embodiments, a shield cage assembly of the present disclosure comprises a metal shield shell and a heat dissipating module. The metal shield shell is composed of a metal plate, and the metal shield shell comprises a plurality of walls and an accommodating space defined by the plurality of walls and extending in a front-rear direction, the accommodating space has a front end port facing forwardly. The heat dissipating module is assembled to one of the plurality of walls of the metal shield shell, and the heat dissipating module comprises a heat dissipating base member, a first heat dissipating member provided to a top of the heat dissipating base member and at least one clip which is sandwiched between the heat dissipating base member and the first heat dissipating member and limited in position, and the clip engages with the metal shield shell, a bottom of the heat dissipating base member covers the wall of the metal shield shell to which the heat dissipating module is assembled.

In some embodiments, the wall of the metal shield shell to which the heat dissipating module is assembled is formed with an opening communicated with the accommodating space, the heat dissipating module further comprises a heat source contact plate provided to the bottom of the heat dissipating base member and extending into the accommodating space via the opening.

In some embodiments, the heat dissipating base member has a heat transfer plate covering the wall of the metal shield shell to which the heat dissipating module is assembled.

In some embodiments, the first heat dissipating member has a plurality of heat dissipating fins formed as a plate shape in the front-rear direction and connected with each other in a mutually parallel manner, and the plurality of heat dissipating fins are connected to a top surface of the heat transfer plate.

In some embodiments, the first heat dissipating member has a plate body which is provided to a top surface of the heat transfer plate and a plurality of heat dissipating fins which are integrally formed, extend from a top surface of the plate body and are parallel to the front-rear direction.

In some embodiments, the metal shield shell comprises side walls respectively positioned at two sides of the wall to which the heat dissipating module is assembled; the heat dissipating base member further has a frame provided to the heat transfer plate, and the frame has a frame body which is provided to the top surface of the heat transfer plate and two side plates which extend from two side edges of the frame body, are parallel to the side walls and adjacent to outer sides of the side walls.

In some embodiments, the heat transfer plate has a first segment provided to the wall of the metal shield shell to which the heat dissipating module is assembled and extending rearwardly to a rear side edge of the wall, and a second segment extending rearwardly to behind the metal shield shell from the first segment; the first heat dissipating member extends from the first segment to the second segment and is provided to the heat transfer plate.

In some embodiments, the heat dissipating module further comprises a second heat dissipating member which is provided to a bottom surface of the heat transfer plate at the second segment.

In some embodiments, a bottom of the first heat dissipating member is formed with at least one bottom recessed groove correspondingly accommodating the clip; the clip is limited between the bottom recessed groove and the heat transfer plate in position.

In some embodiments, the heat dissipating base member has a plate body covering the wall of the metal shield shell to which the heat dissipating module is assembled, and a plurality of heat dissipating fins extending from a top surface of the plate body; the first heat dissipating member has a heat dissipating tube, the plate body and the heat dissipating fins of the heat dissipating base member together define a mounting groove which extends in the front-rear direction and is used for accommodating the heat dissipating tube and at least one top recessed groove which correspondingly accommodates the clip and limits the clip in position.

In some embodiments, the plate body has a first segment provided to the wall of the metal shield shell to which the heat dissipating module is assembled and extending rearwardly to a rear side edge of the wall and a second segment extending rearwardly to behind the metal shield shell from the first segment; the plurality of heat dissipating fins extend from the first segment to the second segment, and the heat dissipating base member further has a plurality of heat dissipating fins which extend from a bottom surface of the plate body at the second segment.

Accordingly, in some embodiments, a shield cage assembly of the present disclosure comprises a metal shield shell and a heat dissipating module. The metal shield shell is composed of a metal plate, and the metal shield shell comprises a plurality of walls and an accommodating space defined by the plurality of walls and extending in a front-rear direction, the accommodating space has a front end port facing forwardly. The heat dissipating module is assembled to one of the walls of the metal shield shell, the heat dissipating module comprises a thermal plate covering and connected to the wall of the metal shield shell which the heat dissipating module is assembled, the thermal plate has a first segment covering the wall of the metal shield shell and extending rearwardly to a rear side edge of the wall, a second segment extending rearwardly to behind the metal shield shell from a rear side of the first segment, and the heat dissipating module further comprises a first heat dissipating member provided to a top surface of the thermal plate and extending from the first segment to the second segment.

In some embodiments, the wall of the metal shield shell to which the heat dissipating module is assembled is formed with an opening communicated with the accommodating space; the heat dissipating module further comprises a heat source contact plate provided to a bottom surface of the thermal plate and extending into the accommodating space via the opening.

In some embodiments, the first heat dissipating member has a plate body which is provided to the top surface of the thermal plate and a plurality of heat dissipating fins which are integrally formed, extend from a top surface of the plate body and are parallel to the front-rear direction.

In some embodiments, the first heat dissipating member has a plurality of heat dissipating fins formed as a plate shape in the front-rear direction and connected with each other in a mutually parallel manner, and the plurality of heat dissipating fins are connected to a top surface of the thermal plate.

In some embodiments, the metal shield shell comprises side walls positioned at two sides of the wall to which the heat dissipating module is assembled; the heat dissipating module further comprises a frame provided to the thermal plate, and the frame has a frame body which is provided to the top surface of the thermal plate and two side plates which extend from two side edges of the frame body, are parallel to the side walls and adjacent to outer sides of the side walls.

In some embodiments, the heat dissipating module further comprises a second heat dissipating member provided to a bottom surface of the thermal plate at the second segment.

In some embodiments, the second heat dissipating member has a plate body which is provided to the thermal plate and a plurality of heat dissipating fins which extend from a bottom surface of the plate body and are parallel to the front-rear direction.

Accordingly, in some embodiments, a shield cage assembly of the present disclosure comprises a metal shield shell, a heat dissipating module and at least one light guide member. The metal shield shell is composed of a metal plate, and the metal shield shell comprises a plurality of walls and an accommodating space defined by the plurality of walls and extending in a front-rear direction, and the accommodating space has a front end port facing forwardly, one of the walls is formed with an opening communicated with the accommodating space, and the metal shield shell further comprises at least two first mounting pieces which are arranged side by side in a left-right direction, positioned at two sides of the opening in the left-right direction, extend upwardly and make piece surface directions thereof parallel to the front-rear direction. The heat dissipating module partially extends into the opening and is assembled to the wall of the metal shield shell forming the opening. The at least one light guide member is provided to the metal shield shell, and the light guide member has at least one light pipe and a first mounting column connected to the light pipe and mounted to the first mounting piece.

In some embodiments, the metal shield shell further comprises a rear end face which is positioned on a opposite side of the front end port and at least two second mounting pieces which are positioned on the rear end face and extend rearwardly; the light guide member further has a second mounting column connected to the light pipe and mounted to the second mounting piece.

In some embodiments, the metal shield shell comprises side walls positioned at two sides of the wall forming the opening; the second mounting pieces respectively integrally extend rearwardly from rear edges of the side walls.

In some embodiments, each light pipe has a light-enter end positioned behind the second mounting column, and the light-enter end is spaced apart from the second mounting column by a distance.

In some embodiments, the first mounting piece is formed with a mortise, and the first mounting column has a tenon correspondingly jointing the mortise.

In some embodiments, the second mounting piece is formed as a long strip shape, and the second mounting column is formed with an insertion hole allowing the second mounting piece to insert.

In some embodiments, the second mounting piece is formed with a mortise, and the second mounting column has a tenon correspondingly jointing the mortise.

The present disclosure at least has the following effects: the heat dissipating module of the shield cage assembly of the present disclosure has the clip used for engaging with the metal shield shell, so that the assembling of the heat dissipating module and the metal shield shell is more convenient and fast. In addition, by the first segment of the thermal plate and the second segment of the thermal plate extending rearwardly to behind the metal shield shell, the size of the first heat dissipating member provided to the thermal plate can be increased, the bottom surface of the second segment of the thermal plate can mount the second heat dissipating member, and the heat can rapidly conducted to the first heat dissipating member and the second heat dissipating member which are positioned within the region outside the heat source via the thermal plate, thereby increasing the heat dissipating efficiency. Moreover, the piece surface directions of the first mounting pieces are parallel to the front-rear direction and the first mounting pieces are positioned at the two sides of the opening, the resistance of the air flow flowing in the front-rear direction is reduced and the heat dissipating efficiency is improved. Also, the second mounting piece is integrally extending rearwardly from the metal shield shell allows the light guide member to be mounted, there is no need to open a hole on the rear end face of the metal shield shell, so as to maintain the electromagnetic shielding effect of the metal shield shell.

BRIEF DESCRIPTION OF THE DRAWINGS

Other features and technical effects of the present disclosure will be apparent in the embodiments referring to the accompanying figures, in which:

FIG. 30 is a perspective view of an eighth embodiment of the shield cage assembly of the present disclosure;

DETAILED DESCRIPTION OF THE PREFERRED EMBODIMENTS

Figure 1:
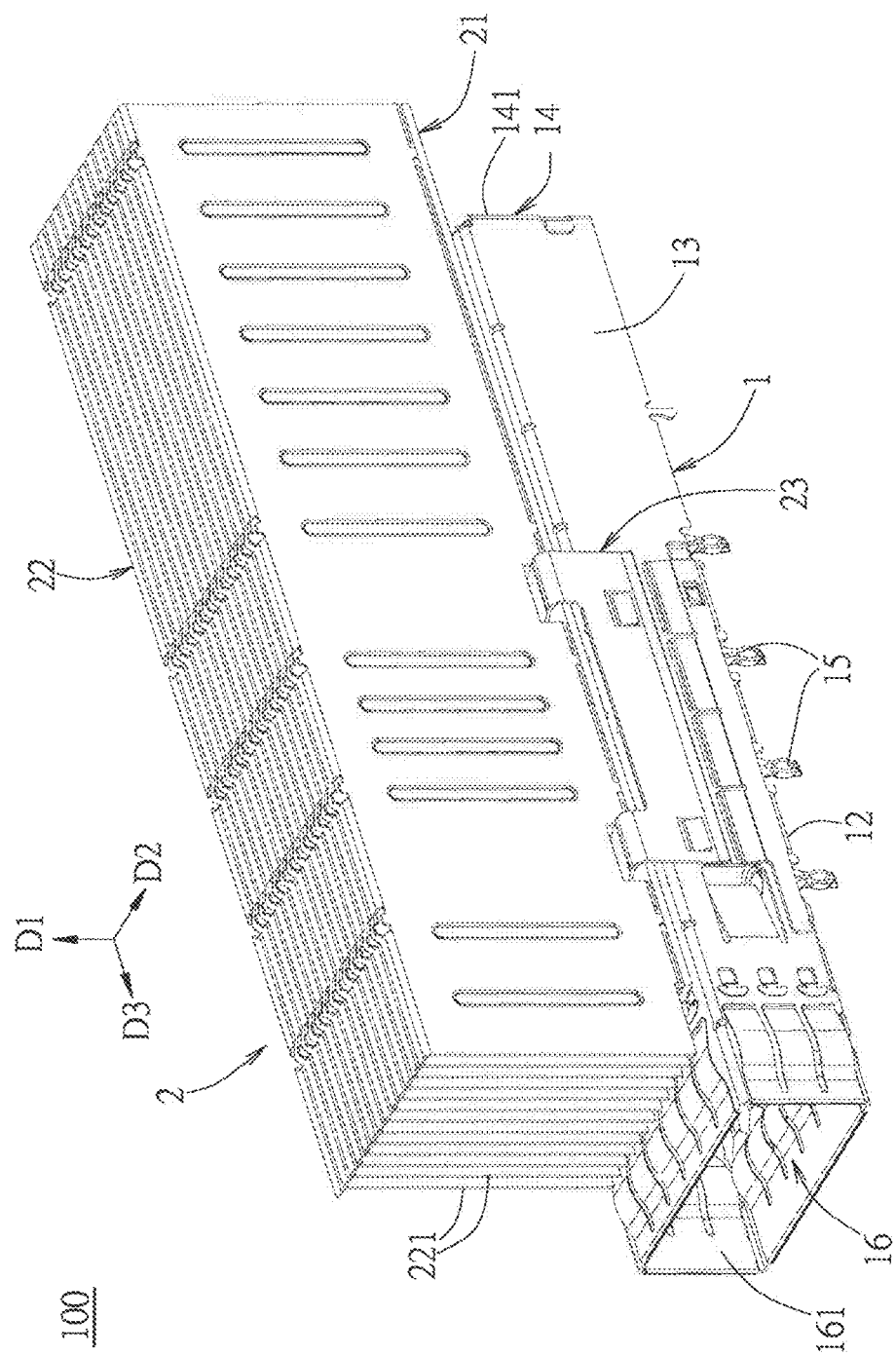
FIG. 1 is a perspective view of a first embodiment of a shield cage assembly of the present disclosure.

Before the present disclosure is described in detail, it should be noted that like elements are denoted by the same reference numerals in the following description.

Figure 2:
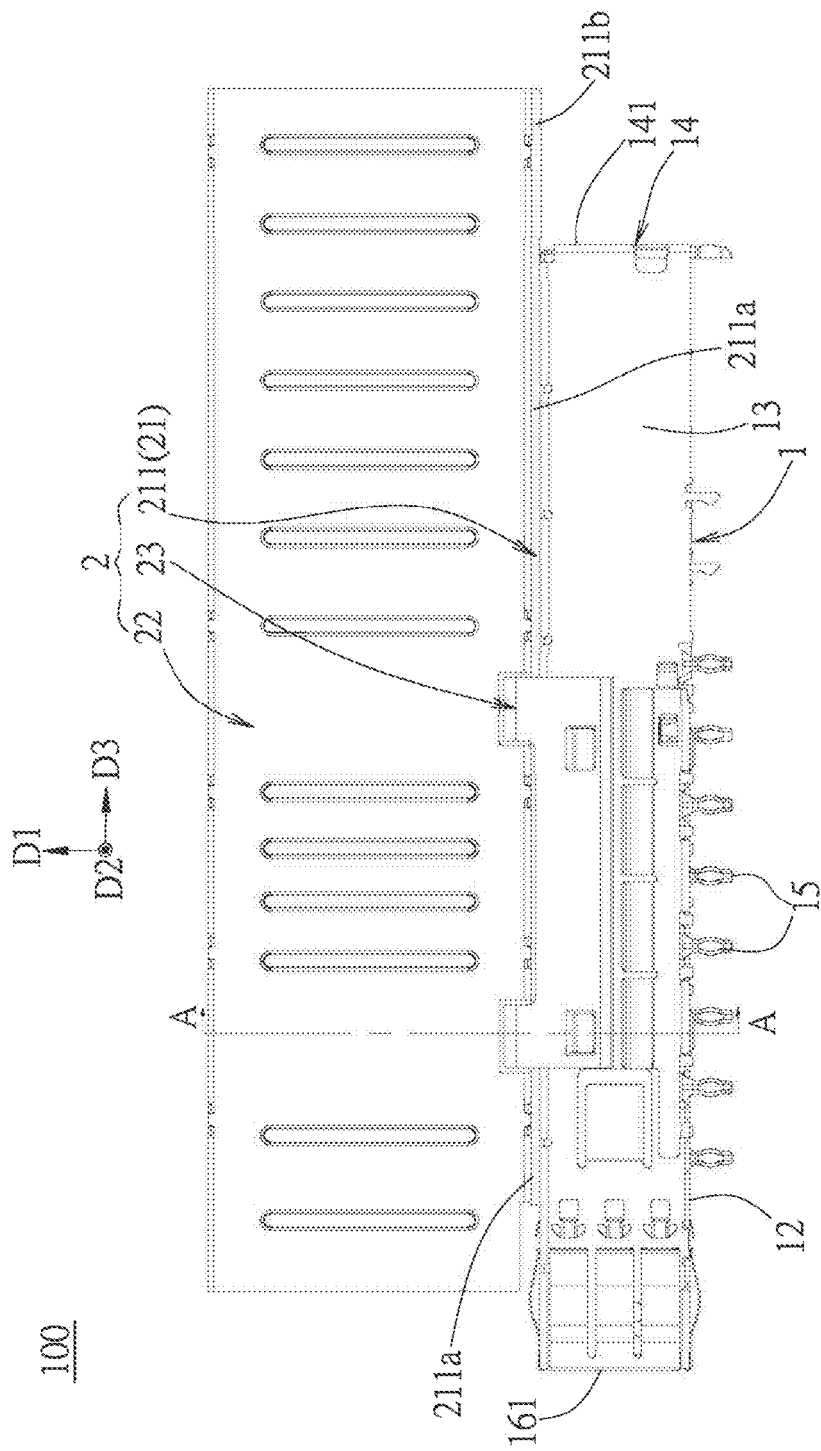
FIG. 2 is a side view of the first embodiment.

FIG. 1 to FIG. 6 illustrate a first embodiment of a shield cage assembly 100 of the present disclosure, referring to FIG. 1 and FIG. 2, the first embodiment comprises a metal shield shell 1 and a heat dissipating module 2.

Figure 3:
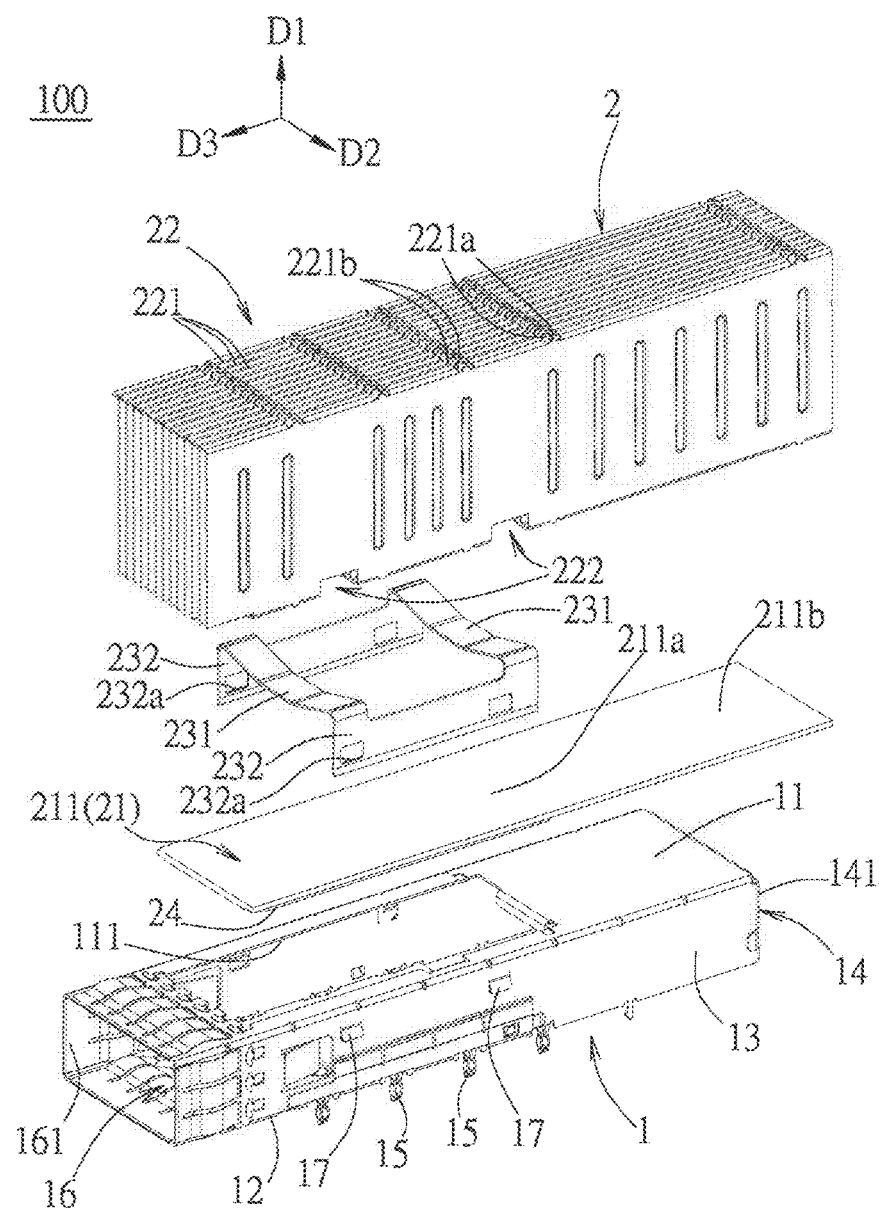
FIG. 3 is an exploded perspective view of the first embodiment.

Referring to FIG. 2 and FIG. 3, the metal shield shell 1 is composed of a metal plate and is used for accommodating an electronic module (comprises a receptacle and a plug, not shown), the metal shield shell 1 has a plurality of walls and an accommodating space 16 formed by the plurality of walls, the plurality of walls comprises a top wall 11, a bottom wall 12 spaced apart from and facing the top wall 11 in an up-down direction D1, two side walls 13 spaced apart from and facing each other in a left-right direction D2 and respectively connected to two sides of the bottom wall 12 and the top wall 11, and a rear wall 14 connected to rear side edges of the top wall 11 and the two side walls 13 and having a rear end face 141, and the metal shield shell 1 further comprises a plurality of legs 15 which extend downwardly from the two side walls 13 and are adapted to be fixed on a circuit board (not shown) and/or to be connected to a ground trace, the top wall 11, the bottom wall 12, the two side walls 13 and the rear wall 14 together define the accommodating space 16 extending in a front-rear direction D3, the accommodating space 16 has a front end port 161 facing forwardly and positioned on an opposite side of the rear wall 14, and the top wall 11 is formed with an opening 111 communicated with the accommodating space 16. A rear section of the accommodating space 16 of the metal shield shell 1 is used for covering a receptacle on the circuit board, and a front section of the accommodating space 16 is used for being inserted by a plug. In the first embodiment, the metal shield shell 1 is described by taking the metal shield shell 1 having one accommodating space 16 as an example, however, it can be understood that the metal shield shell 1 may be a structure having two or more accommodating spaces 16 in other embodiments.

Figure 4:
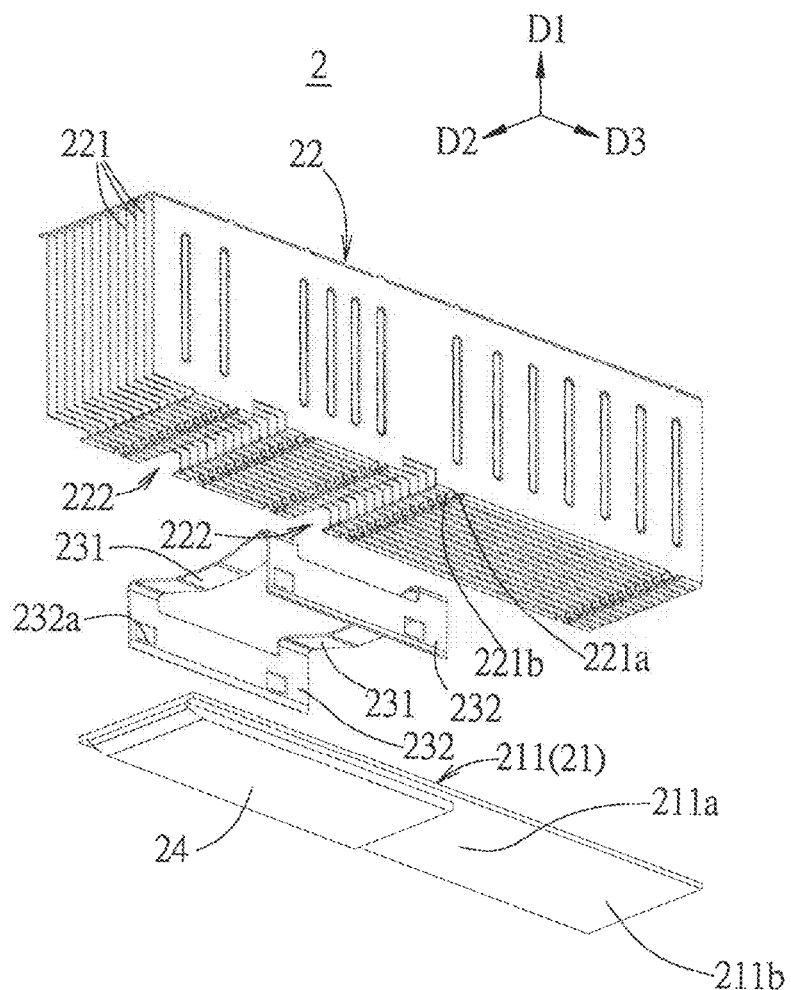
FIG. 4 is an exploded perspective view of the first embodiment from another angle with a metal shield shell of the first embodiment omitted.
Figure 5:
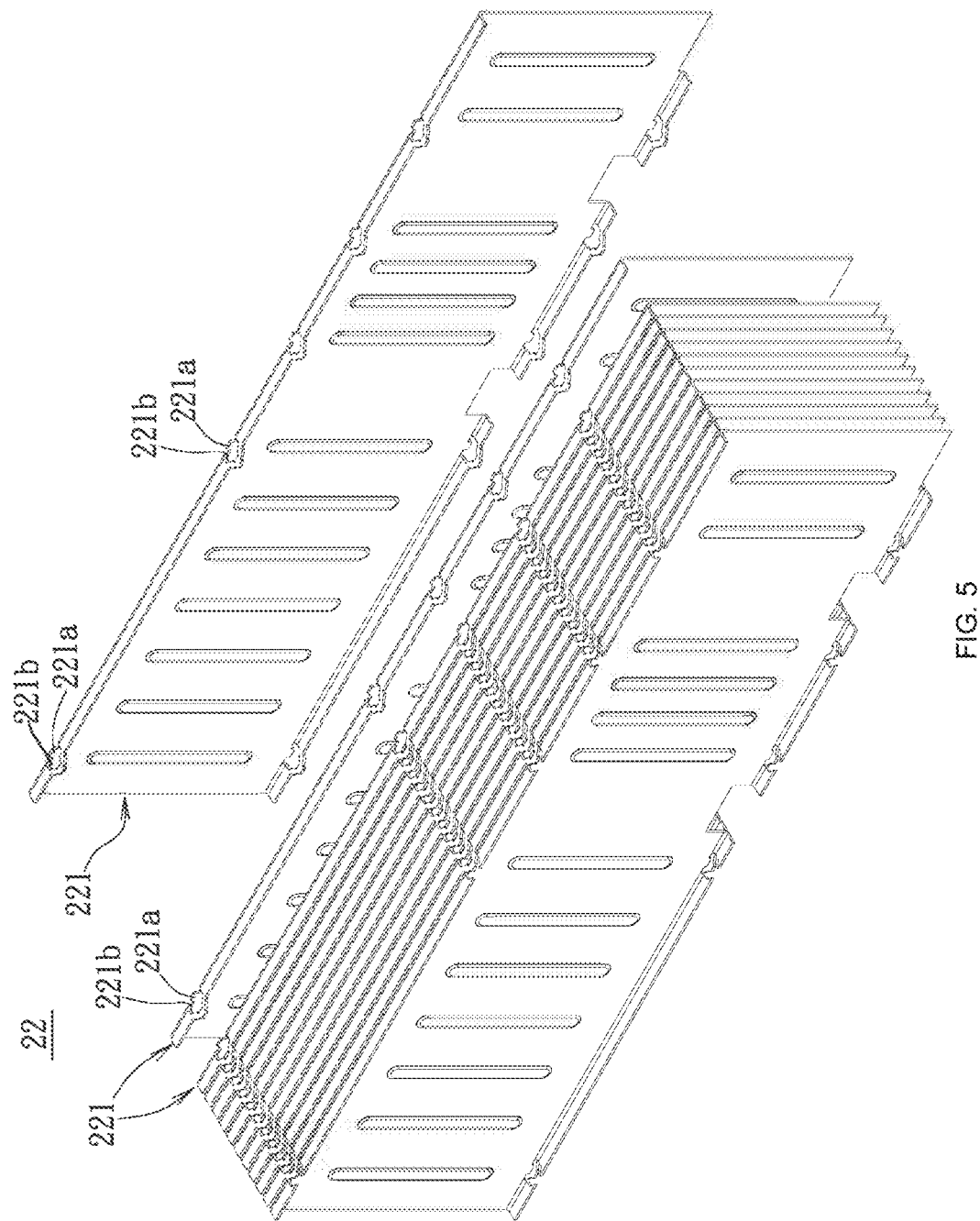
FIG. 5 is an exploded perspective view illustrating a first heat dissipating member of the first embodiment.
Figure 6:
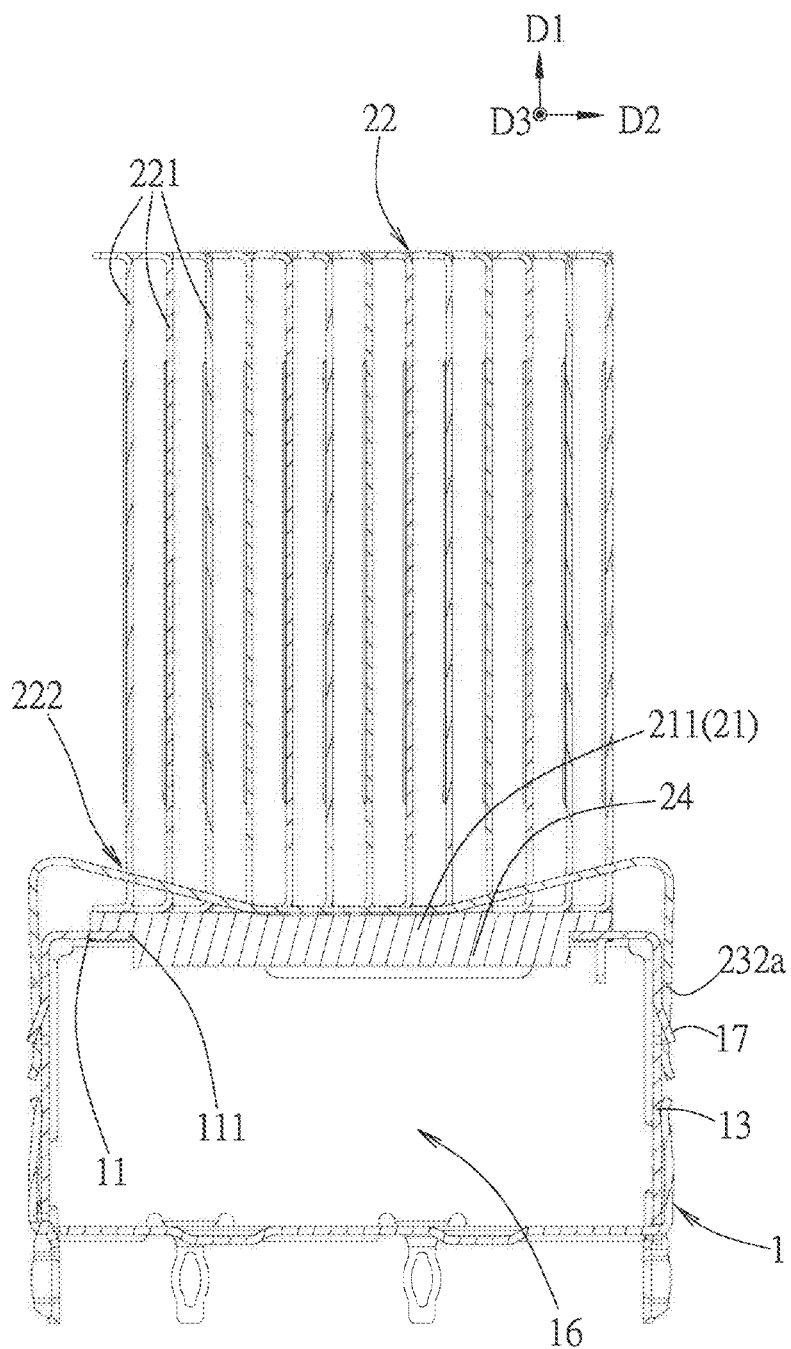
FIG. 6 is a cross sectional view taken along an A-A line of FIG. 2.
Figure 7:
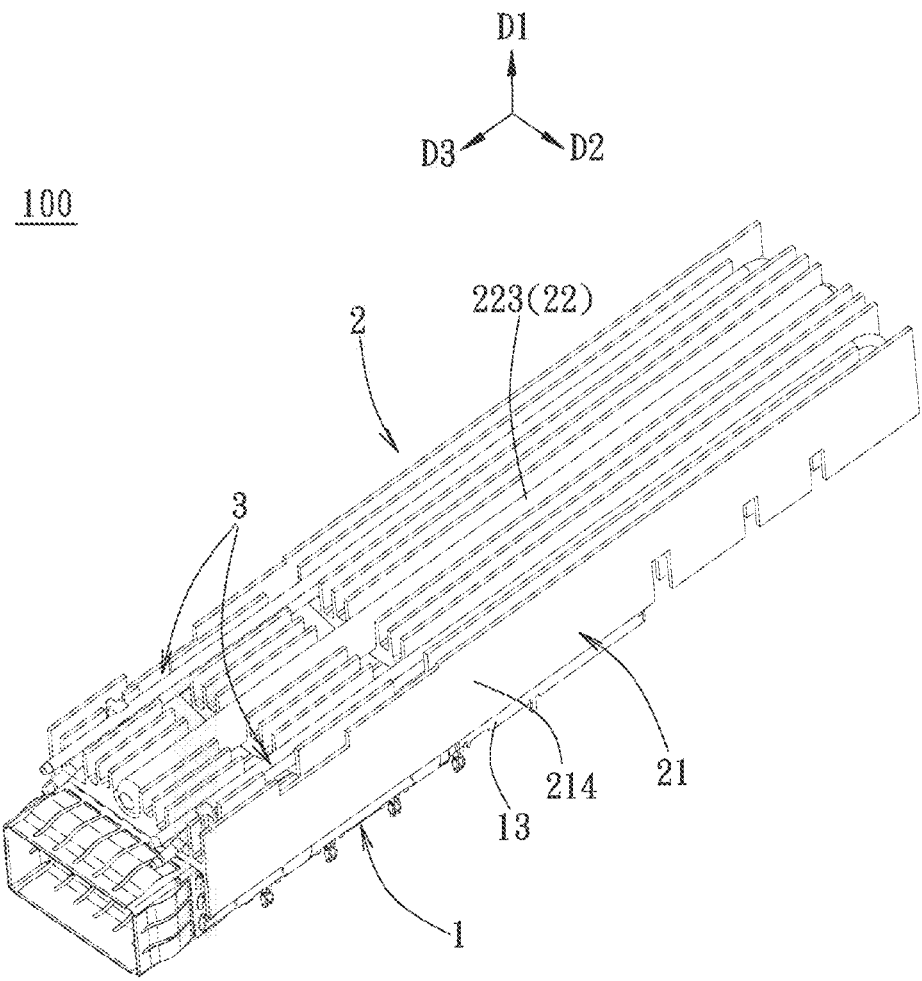
FIG. 7 is a perspective view of a second embodiment of the shield cage assembly of the present disclosure.
Figure 8:
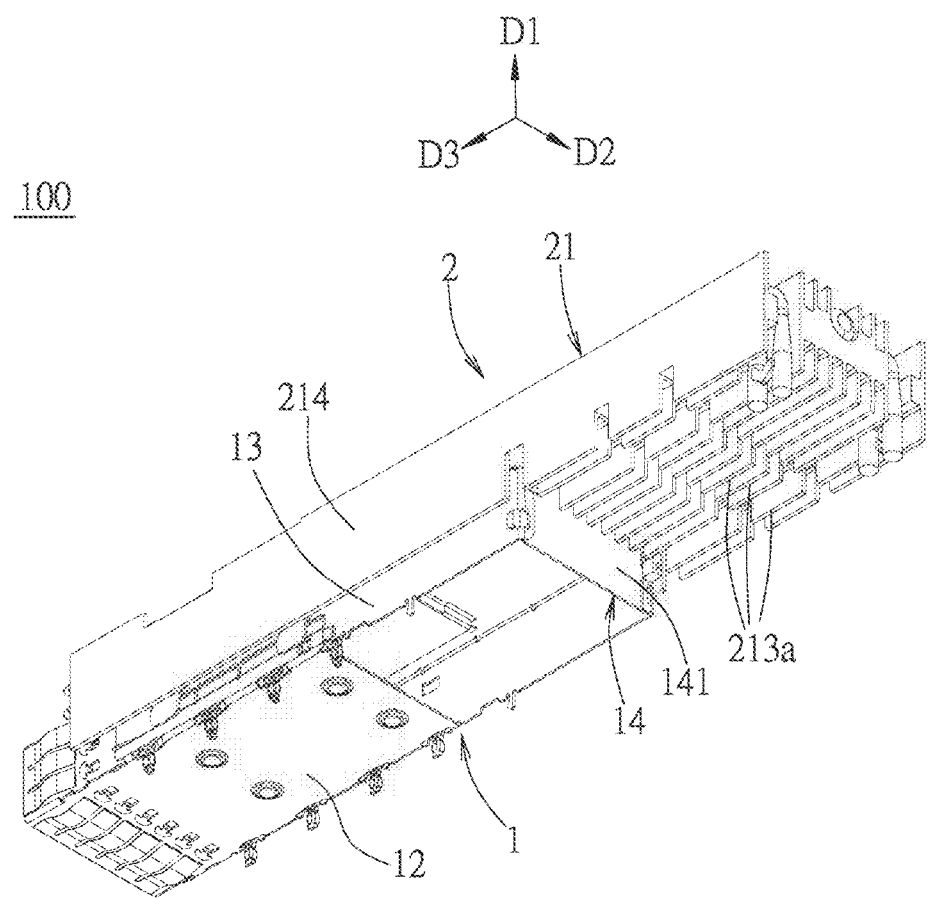
FIG. 8 is another perspective view of the second embodiment from another angle.
Figure 9:
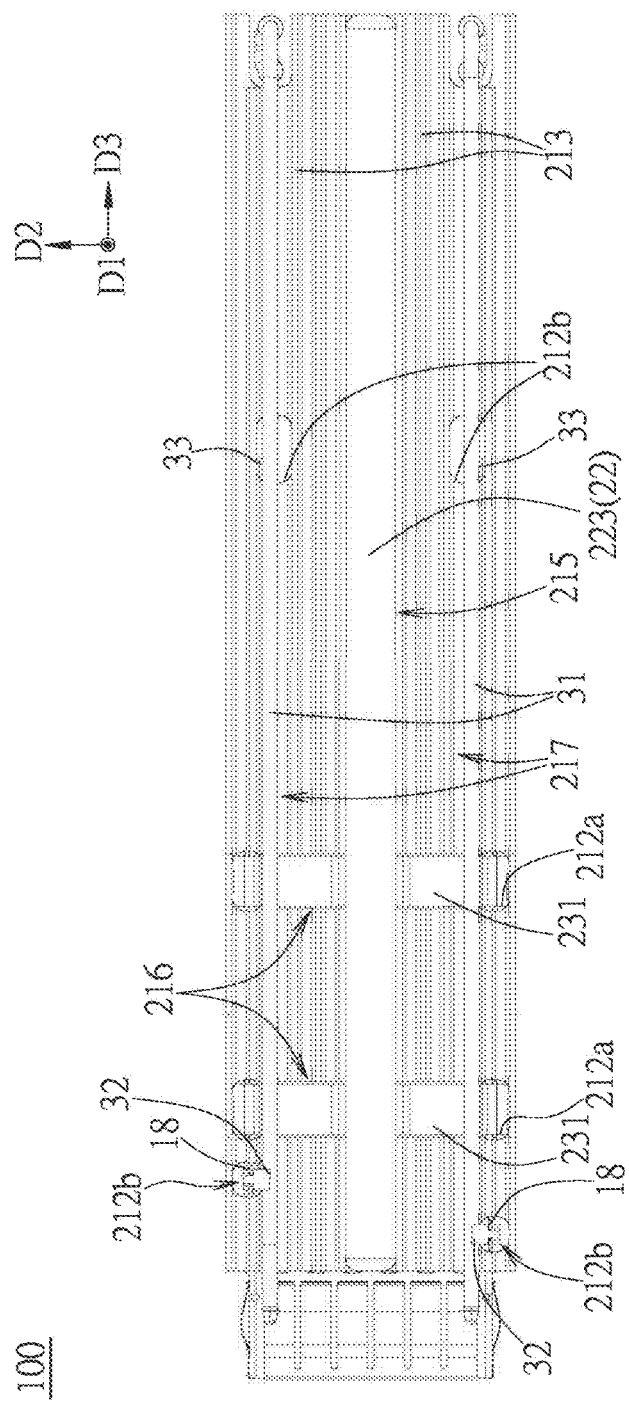
FIG. 9 is a top view of the second embodiment.
Figure 10:
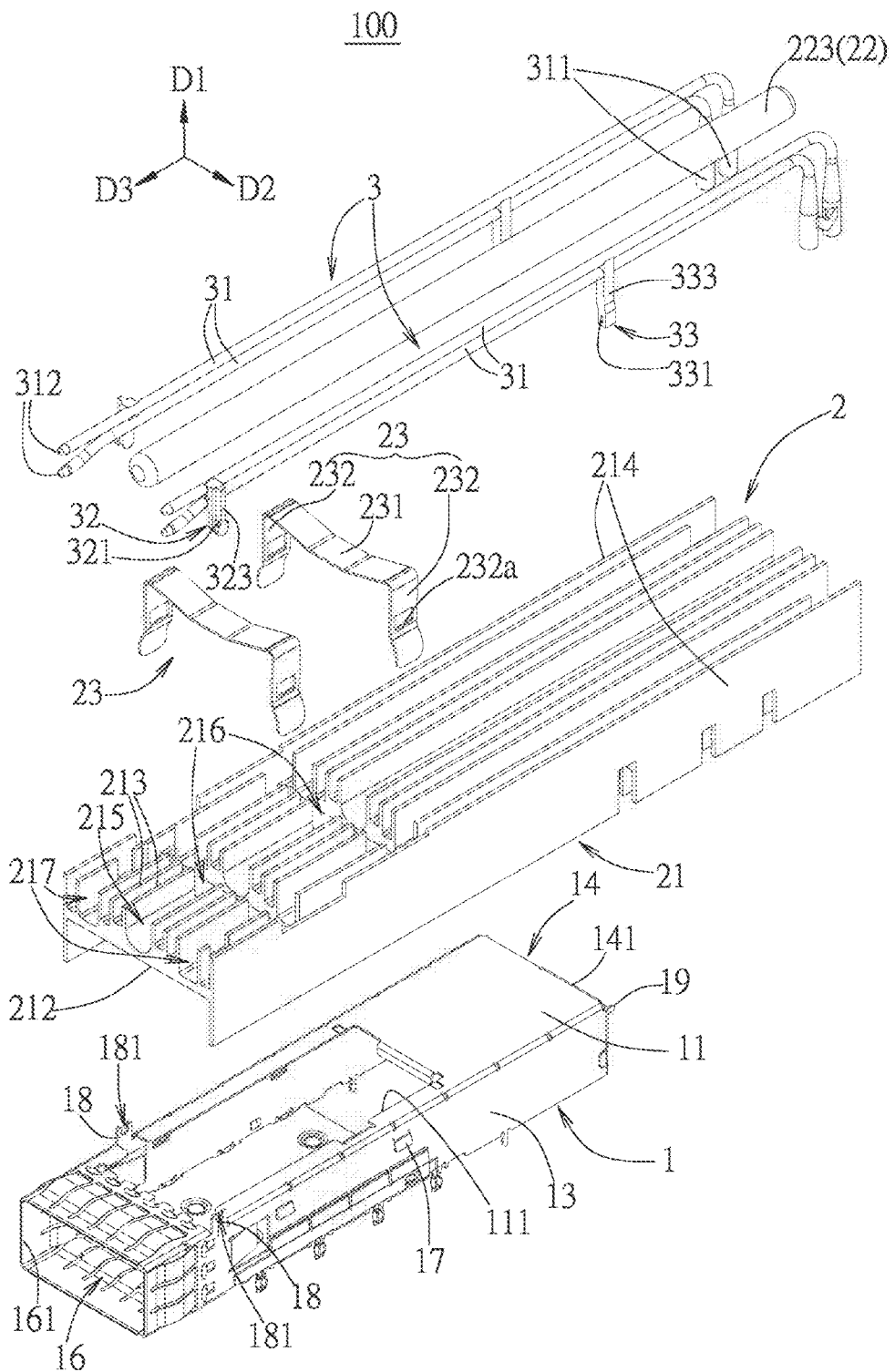
FIG. 10 is an exploded perspective view of the second embodiment.
Figure 11:
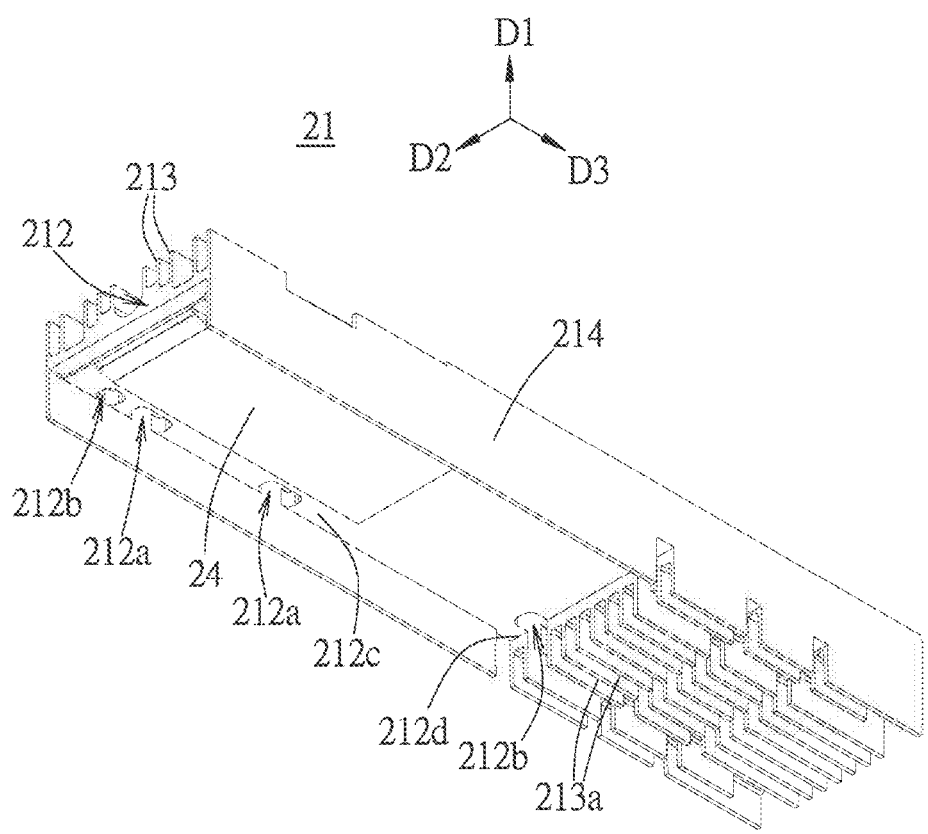
FIG. 11 is a perspective view illustrating a heat dissipating base member and a heat source contact plate of the second embodiment.
Figure 12:
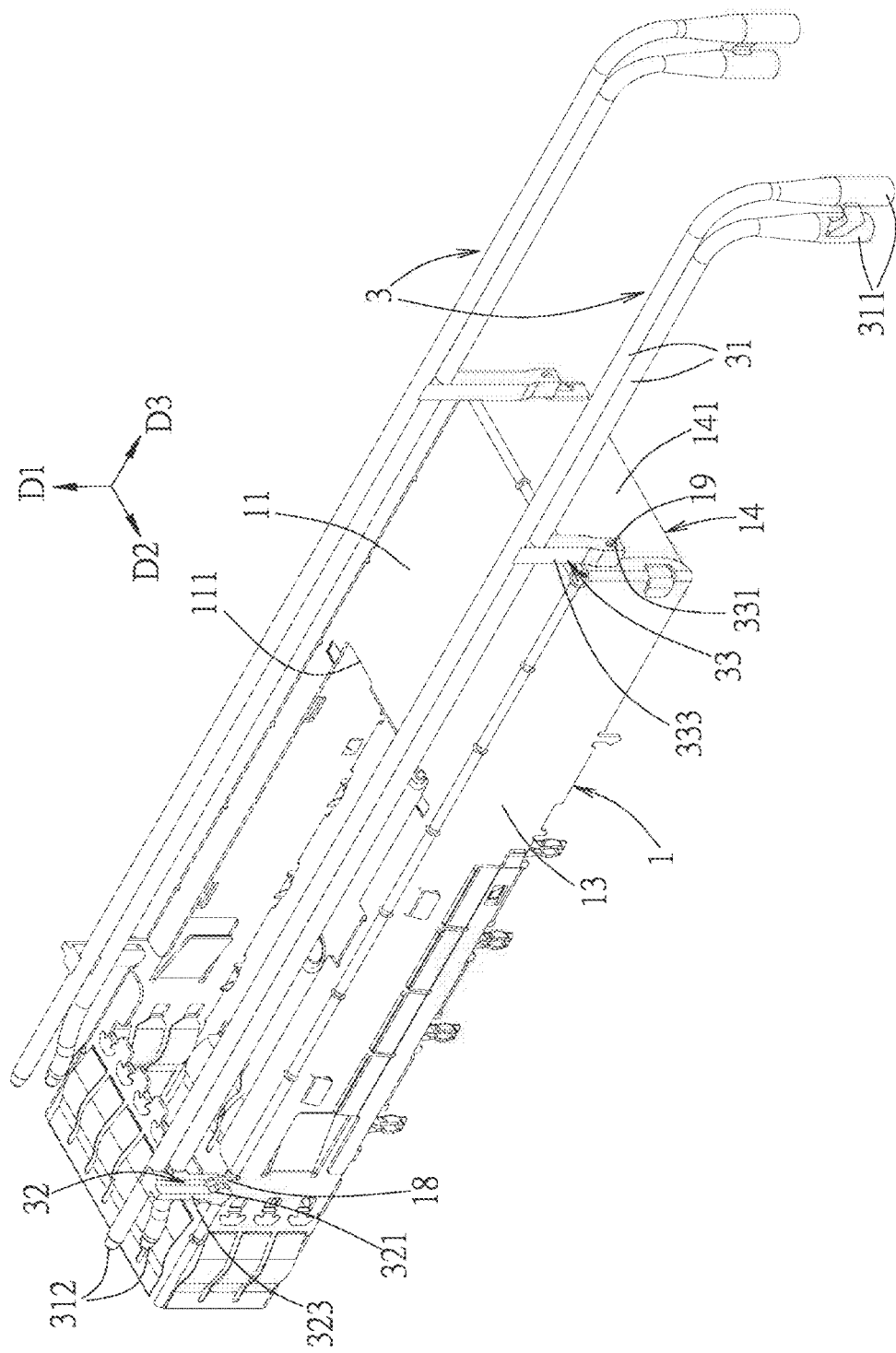
FIG. 12 is a perspective view of the second embodiment with a heat dissipating module of the second embodiment omitted.
Figure 13:
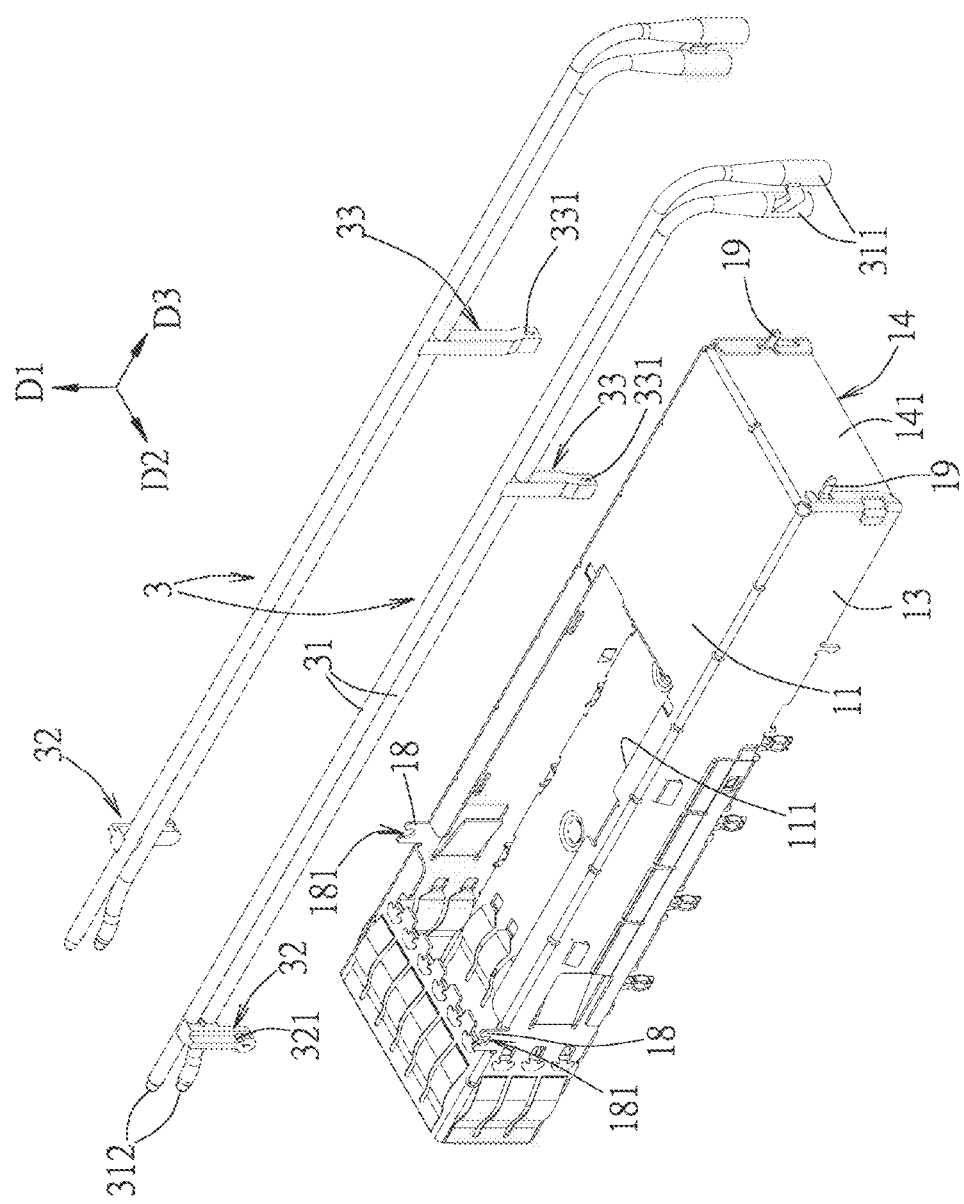
FIG. 13 is an exploded perspective view of FIG. 12.

Referring to FIG. 4 to FIG. 6, the heat dissipating module 2 is provided to the metal shield shell 1, and the heat dissipating module 2 comprises a heat dissipating base member 21, a first heat dissipating member 22 positioned above the heat dissipating base member 21 and provided to a top of the heat dissipating base member 21, and a clip 23 which is sandwiched between the heat dissipating base member 21 and the first heat dissipating member 22 and limited in position. The clip 23 engages with the two side walls 13 of the metal shield shell 1, and the heat dissipating base member 21 is sandwiched between the metal shield shell 1 and the clip 23 and limited in position with the elasticity of the clip 23, so that a bottom of the heat dissipating base member 21 is capable of contacting and covering the top wall 11 of the metal shield shell 1. Because the heat dissipating module 2 has the clip 23 used for engaging with the metal shield shell 1, and the entire heat dissipating module 2 can directly engage with the metal shield shell 1 via the clip 23, so as to make the assembling of the heat dissipating module 2 and the metal shield shell 1 more convenient and fast. In addition, the heat dissipating module 2 further comprises a heat source contact plate 24 provided to the bottom of the heat dissipating base member 21 and extending into the accommodating space 16 via the opening 111 to contact a plug of a heat source, so that thermal energy of the plug can be conducted to the heat dissipating base member 21 via the heat source contact plate 24 to enhance the heat dissipating performance of the heat dissipating module 2. In the first embodiment, the heat dissipating base member 21 has a heat transfer plate 211 covering the top wall 11, and the heat transfer plate 211 may be a plurality of metal solid plate body made of a copper, an aluminum or a material having high heat conduction efficiency, the heat transfer plate 211 and the heat source contact plate 24 can be integrally formed. However, in a variant embodiment, the heat transfer plate 211 can also be replaced by a thermal plate, and the thermal plate is also referred to a vapor chamber. The plate body of the thermal plate is made of a metal material having high heat conduction efficiency (for example, a copper), and the inside of the plate body has a closed chamber filled with an actuating fluid (for example, pure water), so that the thermal plate exhibits the characteristics of making temperature rapidly uniform and achieves the effect of rapid heat conduction by two phase change of liquid-vapor of the actuating fluid continuously circulated in the closed chamber. The metal shield shell 1 further comprises four engaging tabs 17 respectively protruding outwardly from the two side walls 13, and the clip 23 has two retaining segments 231 sandwiched between the heat dissipating base member 21 and the first heat dissipating member 22 and formed as a strip shape, and an engaging segment 232 extending downwardly from two ends of the two retaining segments 231 and engaging with the two side walls 13 of the metal shield shell 1, and the engaging segment 232 is formed with four engaging holes 232*a* to respectively allow the corresponding engaging tabs 17 of the metal shield shell 1 to engage therewith. The first heat dissipating member 22 has a plurality of heat dissipating fins 221 substantially formed as a plate shape in the front-rear direction D3 and connect with each other by latching in a mutually parallel manner, and each heat dissipating fin 221 has a plurality of latch protrusions 221*a* formed on an upper edge and a lower edge of each heat dissipating fin 221 and a plurality of latch holes 221*b* formed on the upper edge and the lower edge of each heat dissipating fin 221 to allow the latch protrusions 221*a* of the adjacent heat dissipating fin 221 to respectively latch thereto, so that the plurality of heat dissipating fins 221 are sequentially latched to each other and are fixed together, and further, an indentation can be formed by pressing each heat dissipating fin 221 at a location where each latch protrusion 221*a* and the corresponding latch hole 221*b* in the same column to enhance engagement strength between the heat dissipating fins 221. A bottom of the first heat dissipating member 22, that is the lower edge of each heat dissipating fin 221, may be connected to a top surface of the heat transfer plate 211 by welding, and the bottom of the first heat dissipating member 22 is formed with two bottom recessed grooves 222 correspondingly accommodating and limiting the retaining segments 231 of the clip 23. In the first embodiment, bottoms of the heat dissipating fins 221 together form the bottom recessed grooves 222, so that the clip 23 is sandwiched between the bottom recessed grooves 222 and the heat transfer plate 211 and limited in position. In a variant embodiment, the first heat dissipating member 22 may also be bonded to the heat dissipating base member 21 by a binder having thermal conductivity, but it is not limited thereto.

In the first embodiment, the heat transfer plate 211 has a first segment 211*a* provided to the top wall 11 and extending rearwardly to a rear side edge of the top wall 11 (i.e., at the rear wall 14) and a second segment 211*b* extending rearwardly to behind the metal shield shell 1 from the rear side of the first segment 211*a* in the front-rear direction D3, and the heat dissipating fins 221 of the first heat dissipating member 22 extend from the first segment 211*a* to the second segment 211*b* and are provided to the heat transfer plate 211. The structure of the heat dissipating fins 221 extending to behind the rear wall 14 of the metal shield shell 1 can increase the heat dissipating area of the heat transfer plate 211 and the plurality of heat dissipating fins 221, in turn increase the heat dissipating performance of the heat dissipating module 2 for the metal shield shell 1.

FIG. 7 to FIG. 13 illustrates a second embodiment of the shield cage assembly 100 of the present disclosure, referring to FIG. 7 to FIG. 11, the difference between the second embodiment and the first embodiment lies in that, the heat dissipating base member 21 has a plate body 212 which is capable of contacting and covering the top wall 11 and integrally connecting the heat source contact plate 24, and the plate body 212 has a first segment 212*c* provided to the top wall 11 and extending rearwardly to the rear side edge of the top wall 11 and a second segment 212*d* extending rearwardly to behind the metal shield shell 1 from the rear side of the first segment 212*c* in the front-rear direction D3, the heat dissipating base member 21 further has a plurality of heat dissipating fins 213 which is integrally formed with and extending upwardly from a top surface of the plate body 212, parallel to the front-rear direction D3 and extend from the first segment 212*c* to the second segment 212*d*, a plurality of heat dissipating fins 213*a* which are integrally formed with and extend downwardly from a bottom surface of the plate body 212 at the second segment 212*d* and are parallel to the front-rear direction D3, and two side plates 214 which are integrally formed with and extending from two side edges of the plate body 212 in the up-down direction D1, parallel to the two side walls 13 and extend from the first segment 212c to the second segment 212d, and the two side plates 214 are respectively adjacent to outer sides of the two side walls 13, by the second segment 212d of the plate body 212, the plurality of heat dissipating fins 213 extending to the second segment 212d, the plurality of heat dissipating fins 213a and the two side plates 214, the heat dissipating area of the heat dissipating base member 21 is increased, in turn the heat dissipating performance of the heat dissipating module 2 for the metal shield shell 1 is increase. The first heat dissipating member 22 has a heat dissipating tube 223, and the heat dissipating module 2 has two clips 23, each clip 23 has a retaining segment 231 and two engaging segments 232.

The heat dissipating base member 21 further has a mounting groove 215 which is defined by the plate body 212 and the heat dissipating fins 213 together, extends in the front-rear direction D3 and is used for accommodating the heat dissipating tube 223, two top recessed grooves 216 which are defined by the plate body 212 and the plurality of heat dissipating fins 213 together, extend in the left-right direction D2, correspondingly accommodate the retaining segments 231 of the two clips 23 and limit the retaining segments 231 of the two clips 23 in position, and four penetrating holes 212a which are formed on the plate body 212 and allow the engaging segments 232 of the two clips 23 to pass through downwardly, and the four penetrating holes 212a are respectively adjacent to the two ends of the two top recessed grooves 216.

Referring to FIG. 9, FIG. 10, FIG. 12 and FIG. 13, in addition, the metal shield shell 1 further comprises two first mounting pieces 18 which are respectively positioned at two sides of the opening 111 in the left-right direction D2, extend upwardly and make piece surface directions thereof parallel to the front-rear direction D3, and two second mounting pieces 19 which are integrally formed with and rearwardly extending away from the rear end face 141 of the rear wall 14 in the front-rear direction D3 and respectively adjacent to the two side walls 13; positions of the first mounting pieces 18 as shown in the figures may be close to the two side walls 13 and be positioned outside side edges of the opening 111, but the first mounting pieces 18 may also extend upwardly from the side edges of the opening 111, the two second mounting pieces 19 respectively extend out from rear edges of the two side walls 13 and piece surface directions of the two second mounting pieces 19 are parallel to the front-rear direction D3. The heat dissipating base member 21 further has two accommodating grooves 217 which extend in the front-rear direction D3 and respectively are close to the two side plates 214, and four through holes 212b which are formed on the plate body 212 and correspond to the two accommodating grooves 217 and the two first mounting pieces 18 and the two second mounting pieces 19. The shield cage assembly 100 further comprises two light guide members 3 which are provided on the metal shield shell 1 and respectively partially accommodate in the two accommodating grooves 217, each light guide member 3 has two light pipes 31, a first mounting column 32 and a second mounting column 33. The two light pipes 31 are arranged side by side in the up-down direction D1 and accommodated in the corresponding accommodating groove 217, and each light pipe 31 is formed as L-shaped like and has a light-enter end 311 which faces downwardly and is positioned behind the rear wall 14 and a light-exit end 312 which faces forwardly and is close to the front end port 161. The light pipe 31 is used to guide the light emitted from a light emitting element (not shown) on the circuit board from the light-enter end 311 to the light-exit end 312. It should be noted that, the light pipe 31 may be provided as one or more than three in number depending on the requirement. In the second embodiment, each light-enter end 311 is positioned behind the corresponding second mounting column 33 and spaced apart from the second mounting column 33 by a distance, so that the light-enter end 311 can bypass the second segment 212d of the plate body 212 to face the light emitting element on the circuit board. The first mounting column 32 is connected to a portion of the two light pipes 31 close to the light-exit end 312 and passes through the corresponding through hole 212b to mount to the corresponding first mounting piece 18, and the second mounting column 33 is connected to a portion of the two light pipes 31 close to the light-enter end 311 and passes through the corresponding through hole 212b to mount to the corresponding second mounting piece 19. In the second embodiment, each first mounting piece 18 is formed with a mortise 181, and each first mounting column 32 has a tenon 321 correspondingly jointing the mortise 181, each second mounting piece 19 is formed as a long strip shape, and each second mounting column 33 is formed with an insertion hole 331 allowing the second mounting piece 19 to insert. Each first mounting column 32 has a mounting segment 323 which extends downwardly from the two light pipes 31 and has the tenon 321 to mount to the first mounting piece 18, and each second mounting column 33 has a mounting segment 333 which extending downwardly from the two light pipes 31 and has the insertion hole 331. The two light guide members 3 are fixed to the metal shield shell 1 by the first mounting column 32 and the second mounting column 33. By the two first mounting pieces 18 which make the piece surface directions thereof parallel to the front-rear direction D3 and are positioned at two sides of the opening 111, the resistance of the air flow flowing in the front-rear direction D3 is reduced and the heat dissipating efficiency is improved. By the second mounting piece 19 which is integrally formed with and extending rearwardly from the metal shield shell 1 and allows the light guide member 3 to be mounted, there is no need to open a hole on the rear end face 141 of the metal shield shell 1, electromagnetic shielding effect of the metal shield shell 1 can be improved.

Figure 14:
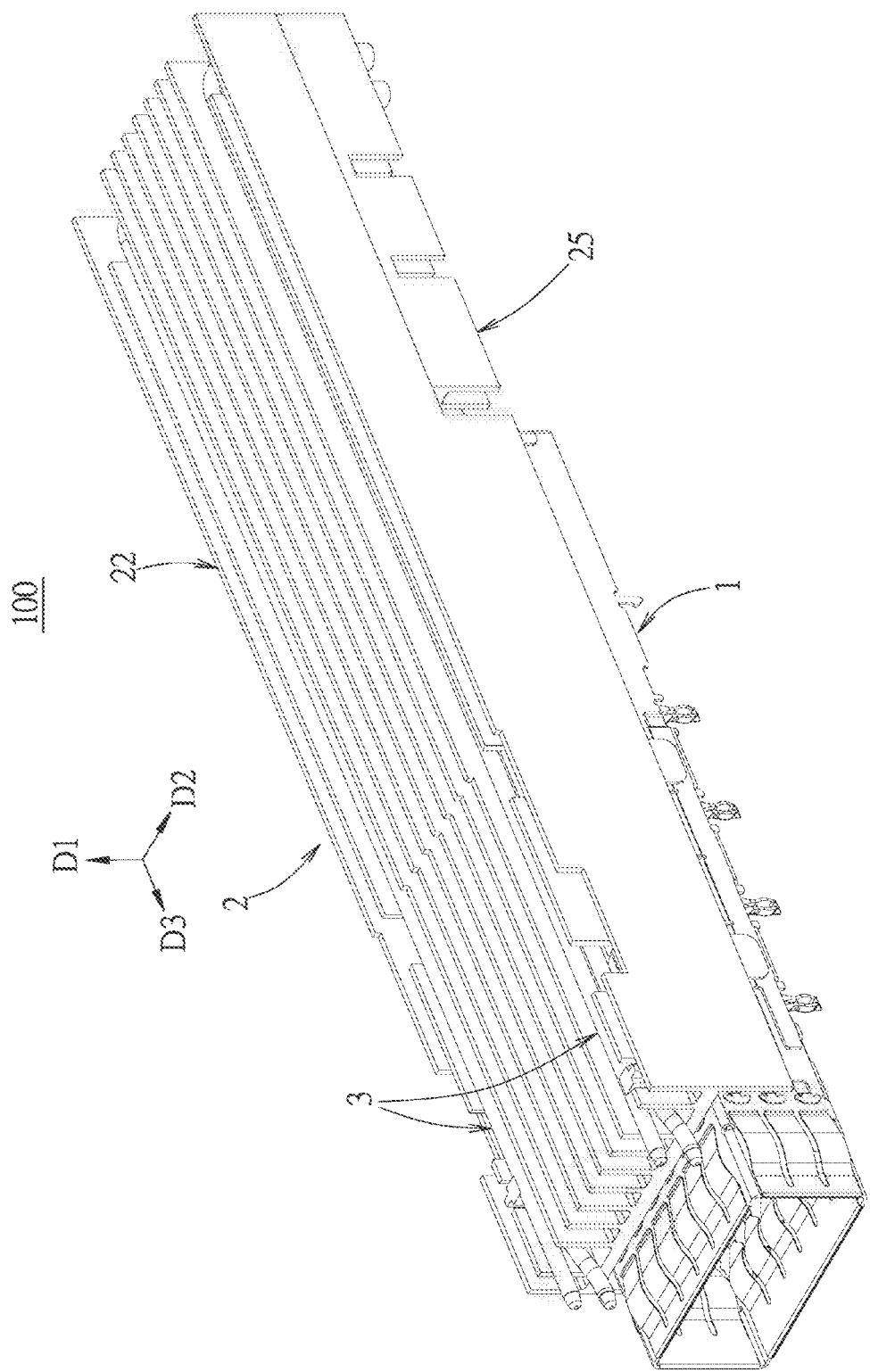
FIG. 14 is a perspective view of a third embodiment of the shield cage assembly of the present disclosure.
Figure 15:
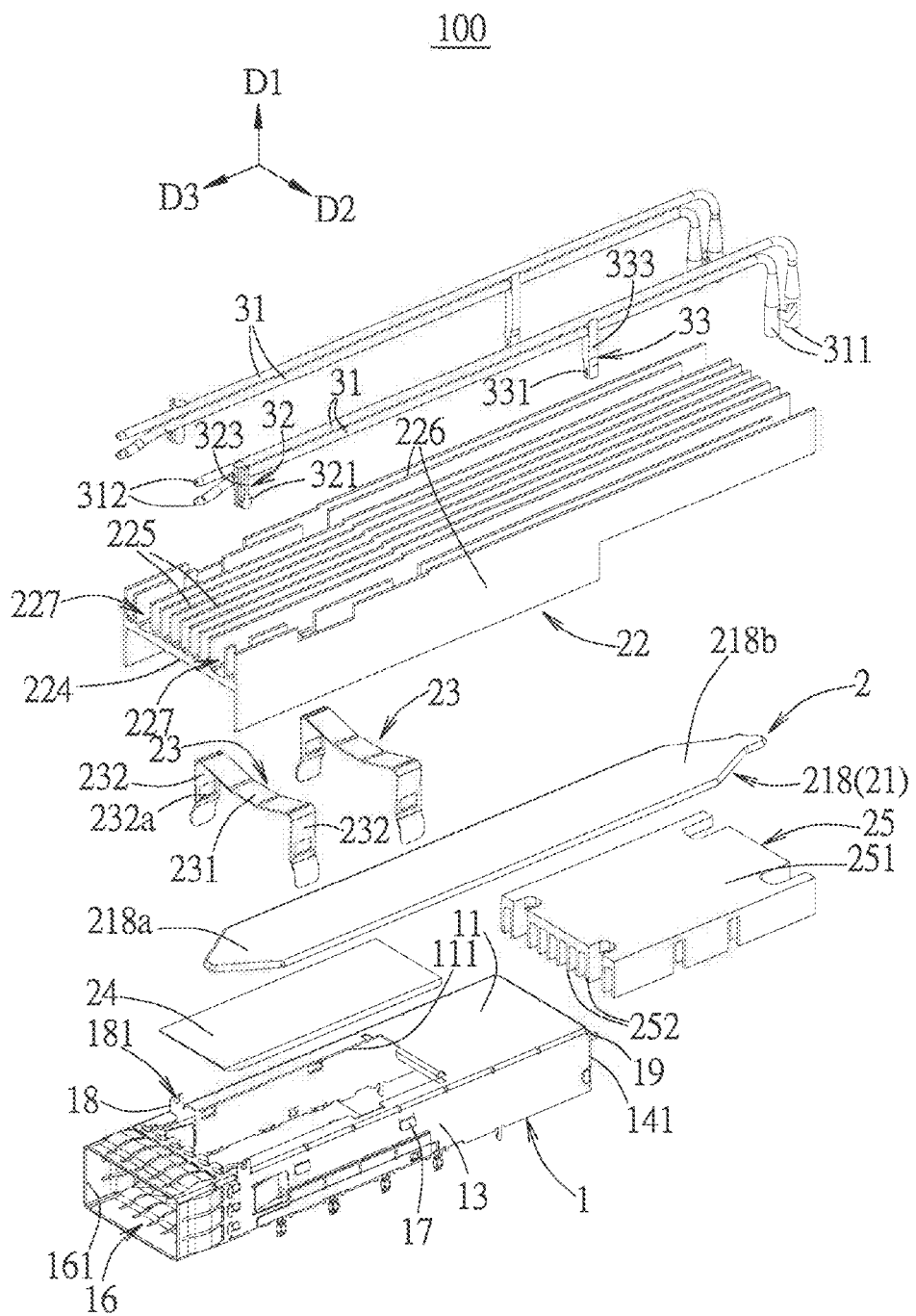
FIG. 15 is an exploded perspective view of the third embodiment.
Figure 16:
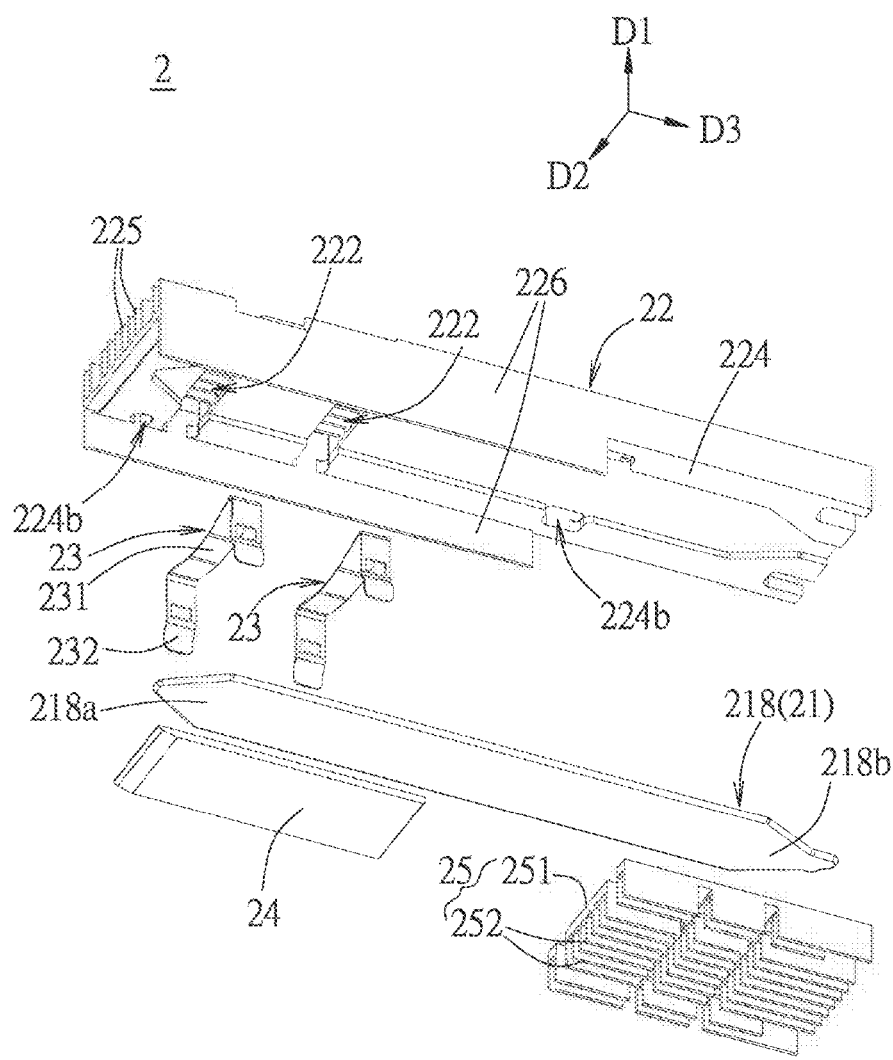
FIG. 16 is a perspective view illustrating the heat dissipating module of the third embodiment from another angle.
Figure 17:
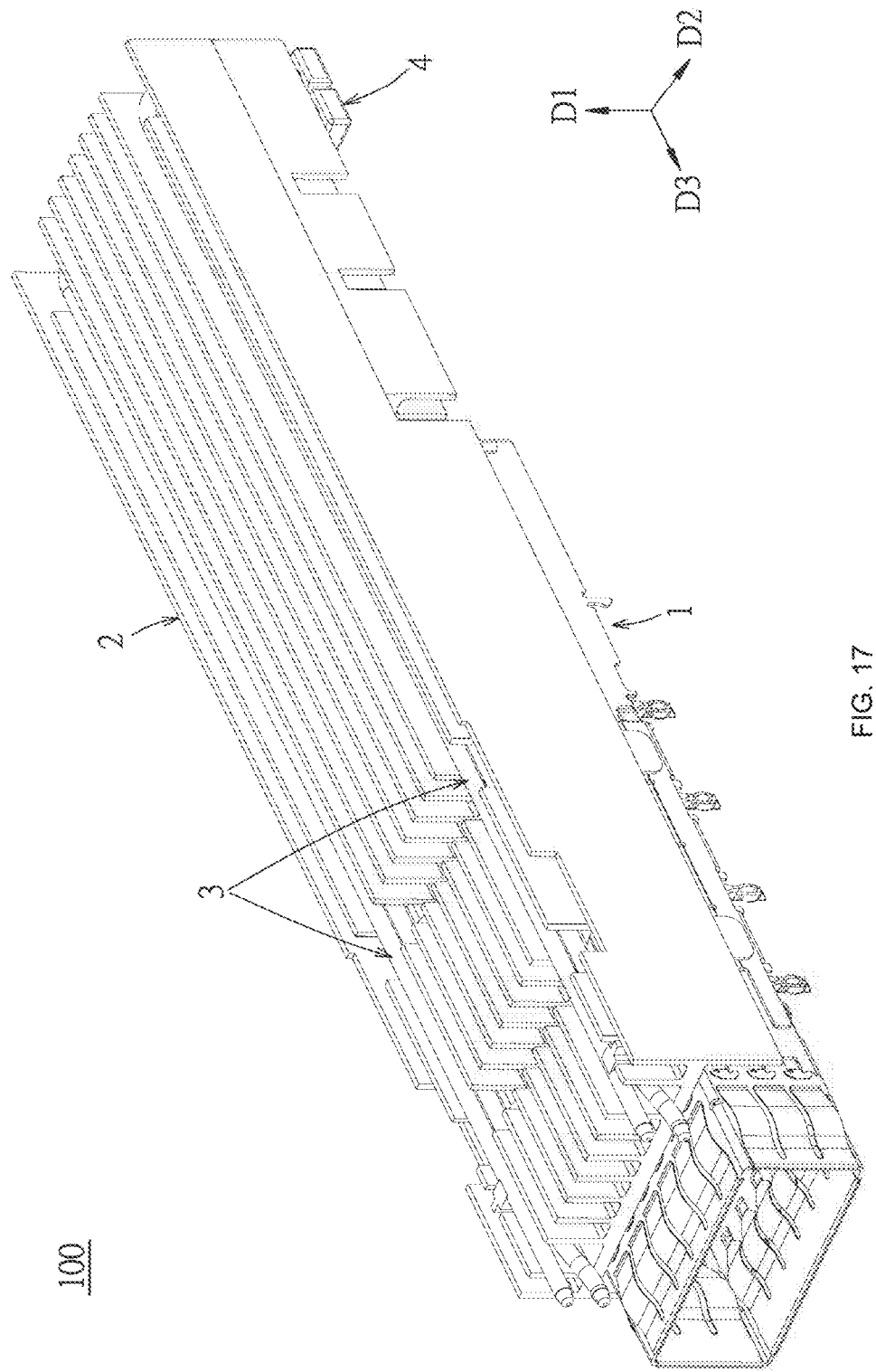
FIG. 17 is a perspective view of a fourth embodiment of the shield cage assembly of the present disclosure.
Figure 18:
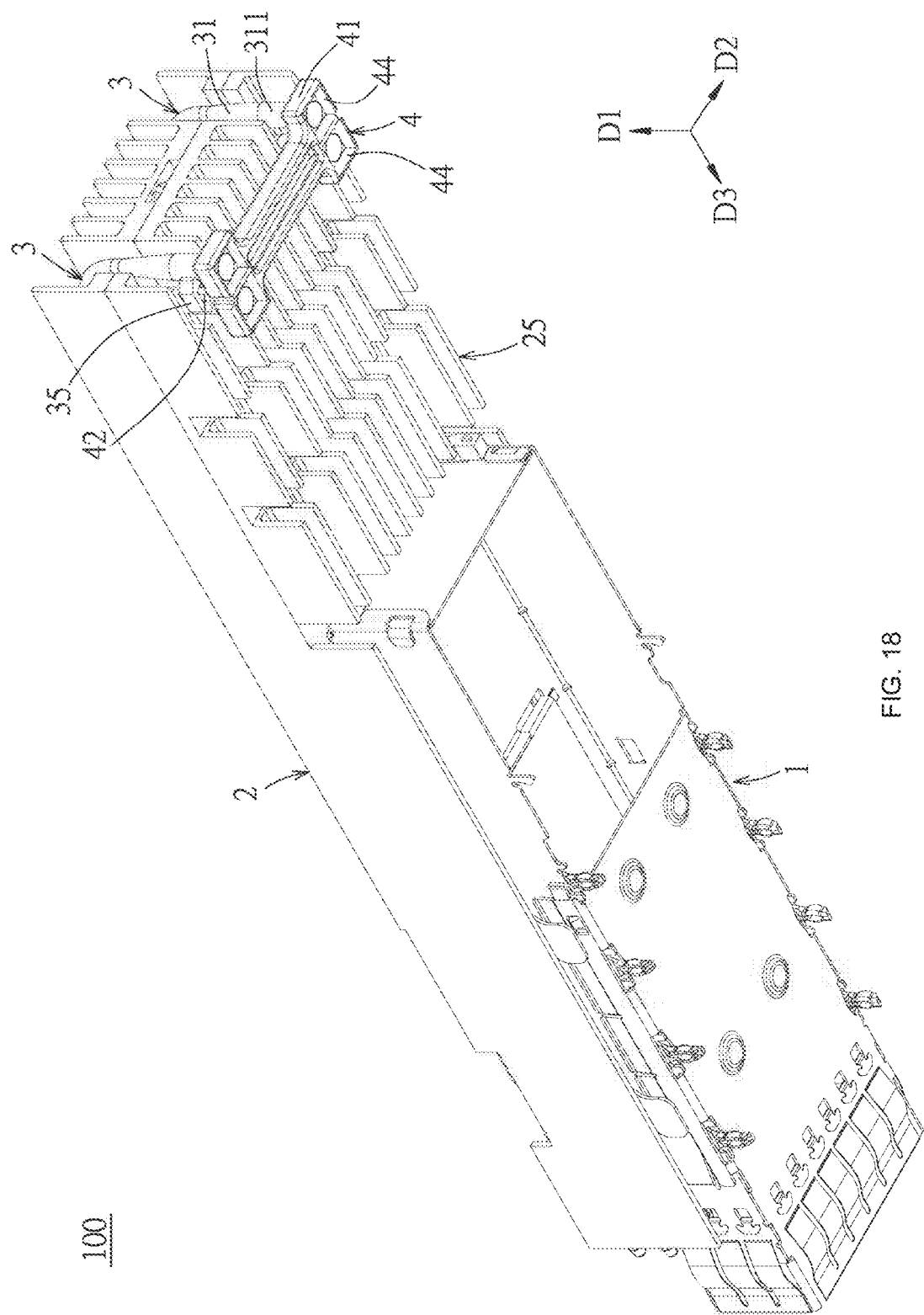
FIG. 18 is a perspective view of the fourth embodiment from another angle.
Figure 19:
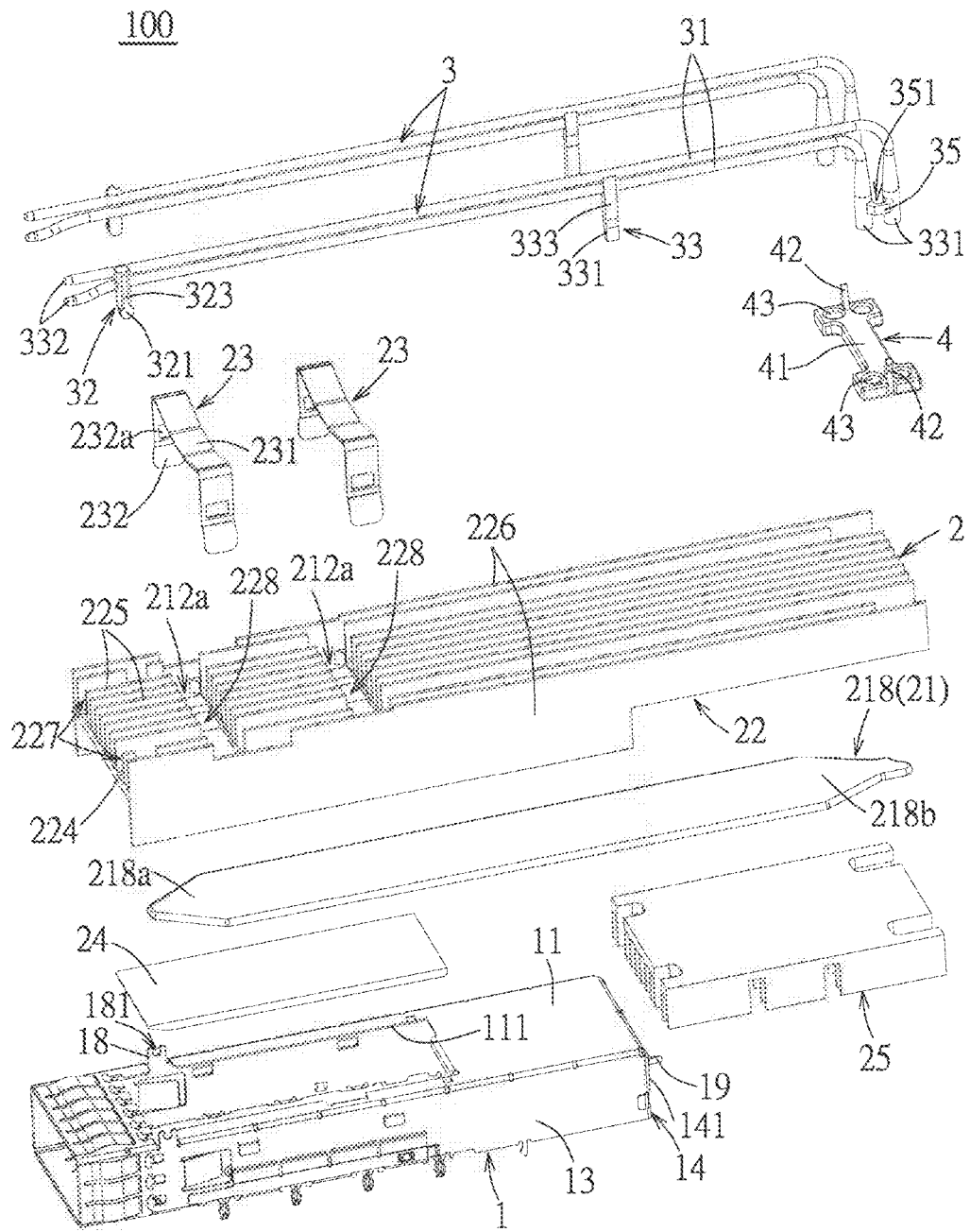
FIG. 19 is an exploded perspective view of the fourth embodiment.
Figure 20:
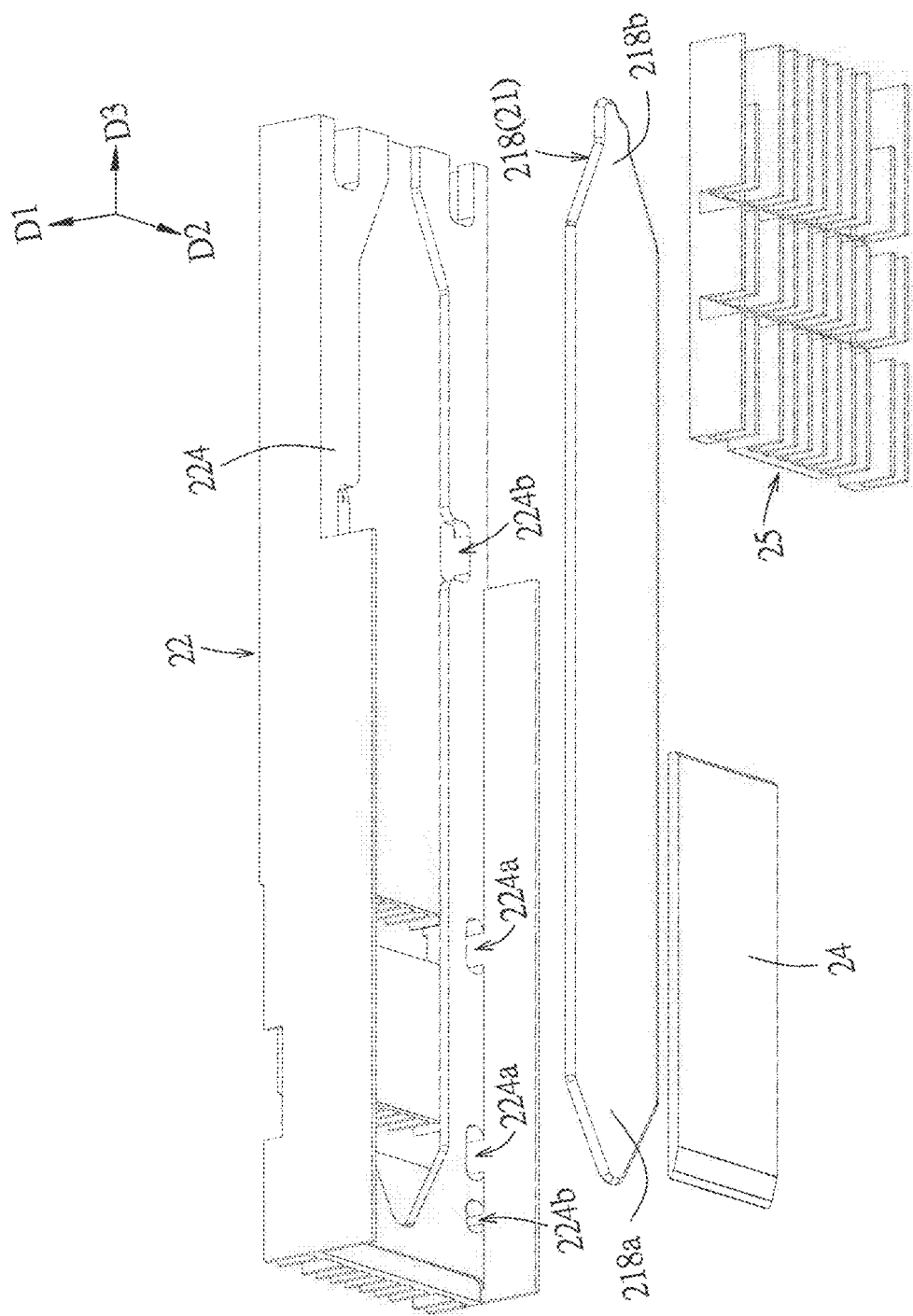
FIG. 20 is an exploded perspective view viewed from another angle and illustrating the heat dissipating module of the fourth embodiment.

Referring to FIG. 14 to FIG. 16, the difference between a third embodiment of the shield cage assembly 100 of the present disclosure and the first embodiment lies in that, the heat dissipating base member 21 of the heat dissipating module 2 has a thermal plate 218, the thermal plate 218 and the heat source contact plate 24 are separately fabricated and combined together in the third embodiment, the thermal plate 218 has a first segment 218a which covers the top wall 11 and extending rearwardly to the rear side edge of the top wall 11 and a second segment 218b which extending rearwardly to behind the metal shield shell 1 from the rear side of the first segment 218a in the front-rear direction D3. The heat dissipating module 2 has two clips 23, and each clip 23 has a retaining segment 231 and two engaging segments 232. The first heat dissipating member 22 can be integrally formed by aluminum extrusion, and the first heat dissipating member 22 has a plate body 224 which is provided to a top surface of the thermal plate 218 and makes a shape of a bottom thereof correspond to the thermal plate 218, a plurality of heat dissipating fins 225 which extend upwardly from a top surface of the plate body 224 and are parallel to the front-rear direction D3, two side plates 226 which extend from two side edges of the plate body 224 in the up-down direction D1 and are parallel to the two side walls 13, and two bottom recessed grooves 222 which are formed from a bottom of the plate body 212 and correspondingly accommodate the retaining segments 231 of the two clips 23 and limit the retaining segments 231 of the two clips 23 in position. Moreover, the heat dissipating module 2 further has a second heat dissipating member 25 which is provided to a bottom surface of the thermal plate 218 at the second segment 218b, and the second heat dissipating member 25 has a plate body 251 which is provided to the thermal plate 218 and a plurality of heat dissipating fins 252 which extend downwardly from a bottom surface of the plate body 251 and are parallel to the front-rear direction D3. By the second segment 218b which extends rearwardly to behind the metal shield shell 1 from the first segment 218a of the thermal plate 218, a size of the first heat dissipating member 22 provided to the thermal plate 218 is increased, by that the heat is rapidly conducted to the first heat dissipating member 22 and the second heat dissipating member 25 which are positioned within a region outside the heat source (i.e., the metal shield shell 1) via the thermal plate 218, the heat dissipating efficiency can be increased.

In the third embodiment, the shield cage assembly 100 further comprises two light guide members 3, the metal shield shell 1 further has two first mounting pieces 18 and two second mounting pieces 19 allow the two light guide members 3 to be mounted, and the structures of the first mounting piece 18 and the second mounting piece 19 are substantially the same as those of the second embodiment, thus detailed description will be omitted. In addition, the first heat dissipating member 22 further has two accommodating grooves 227 which extend in the front-rear direction D3, respectively are close to the two side plates 226 and used for accommodating the light pipes 31 of the two light guide members 3 and four through holes 224b which are formed on the plate body 224 and respectively allow the two first mounting pieces 18 and the two second mounting columns 33 to passed through.

Referring to FIG. 17 to FIG. 20, the difference between a fourth embodiment of the shield cage assembly 100 of the present disclosure and the third embodiment lies in that, after the heat dissipating base member 21 and the first heat dissipating member 22 are assembled and connected with each other, the two clips 23 engage with the metal shield shell 1 from above the heat dissipating base member 21 and the first heat dissipating member 22 and fix the heat dissipating base member 21 and the first heat dissipating member 22, that is, in the fourth embodiment, the heat dissipating base member 21 and the first heat dissipating member 22 are sandwiched between the retaining segments 231 of the two clips 23 and the top wall 11 of the metal shield shell 1, and the first heat dissipating member 22 has two top recessed grooves 228 which are defined by the plate body 224 and a plurality of heat dissipating fins 225, extend in the left-right direction D2 and correspondingly accommodate the retaining segments 231 of the two clips 23 and limit the retaining segments 231 of the two clips 23 in position and four penetrating holes 224a which are formed on the plate body 224 and allow the engaging segments 232 of the two clips 23 to pass through downwardly, the four penetrating holes 224a are respectively adjacent to two ends of the two top recessed grooves 228.

In addition, in the fourth embodiment, the shield cage assembly 100 further comprises a connecting member 4 provided to the two light guide members 3, each light guide member 3 further has a latch column 35 which is connected to portions of the two light pipes 31 adjacent to the light-enter ends 311 and makes an inner side thereof formed with a latch recessed groove 351, and the connecting member 4 has a body 41, two latch protruding bars 42 which are integrally formed with and respectively extend from two sides of the body 41 and latch to the two latch recessed grooves 351, four upper accommodating holes 43 which are respectively formed on a top surface of the body 41 and used for accommodating the light-enter ends 311 of the four light pipes 31, and four lower accommodating holes 44 which respectively formed on a bottom surface of the body 41 and used for accommodating the previously mentioned light emitting element (not shown). The four upper accommodating holes 43 are respectively communicated with the four lower accommodating holes 44, so that the light of the light emitting element can be transmitted to the light-enter ends 311 of the four light pipes 31 via the connecting member 4, so as to ensure that the light of the light emitting element can be transmitted via the four light pipes 31.

Figure 21:
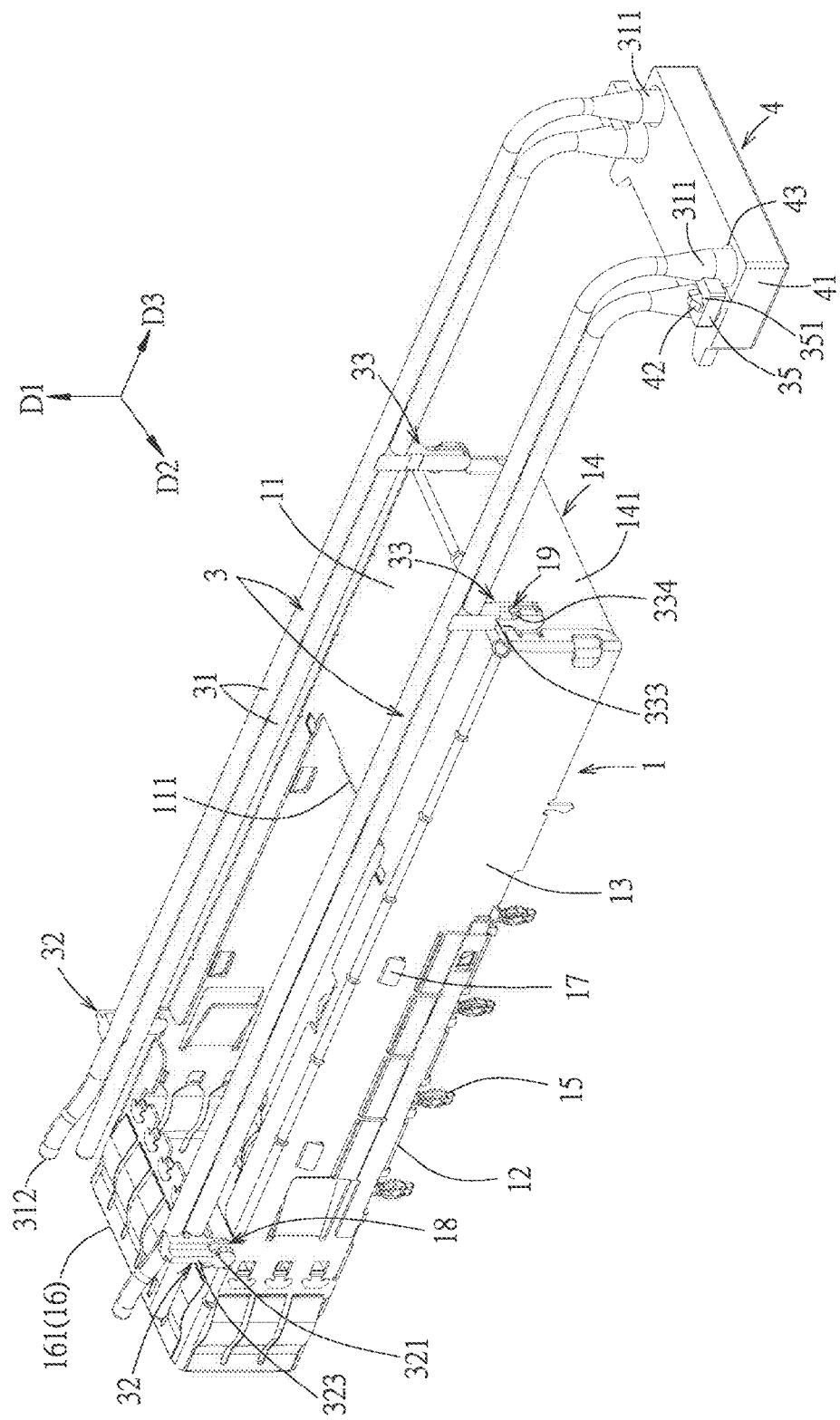
FIG. 21 is a perspective view of a fifth embodiment of the shield cage assembly of the present disclosure with the heat dissipating module omitted.
Figure 22:
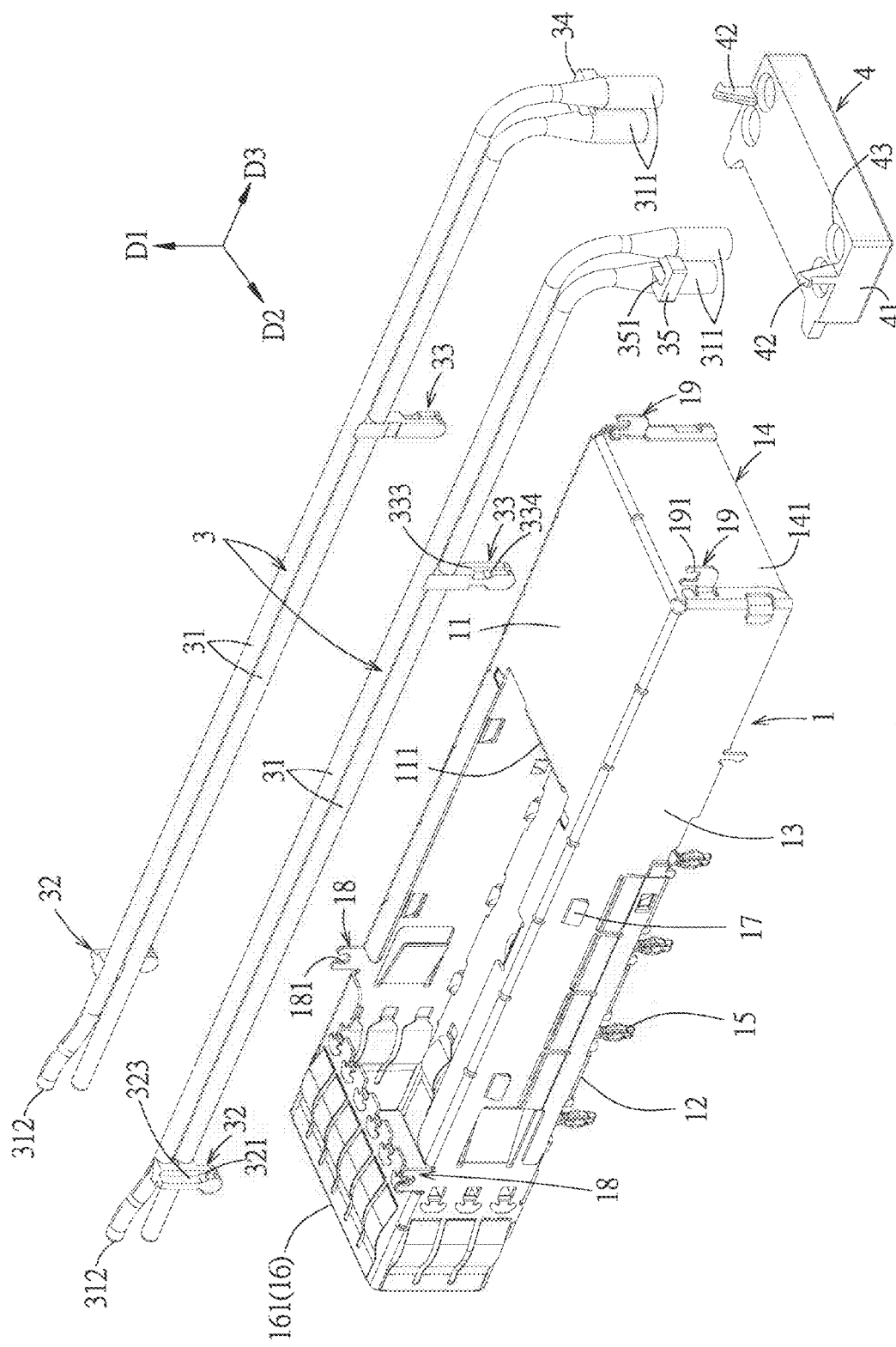
FIG. 22 is an exploded perspective view of FIG. 21.
Figure 23:
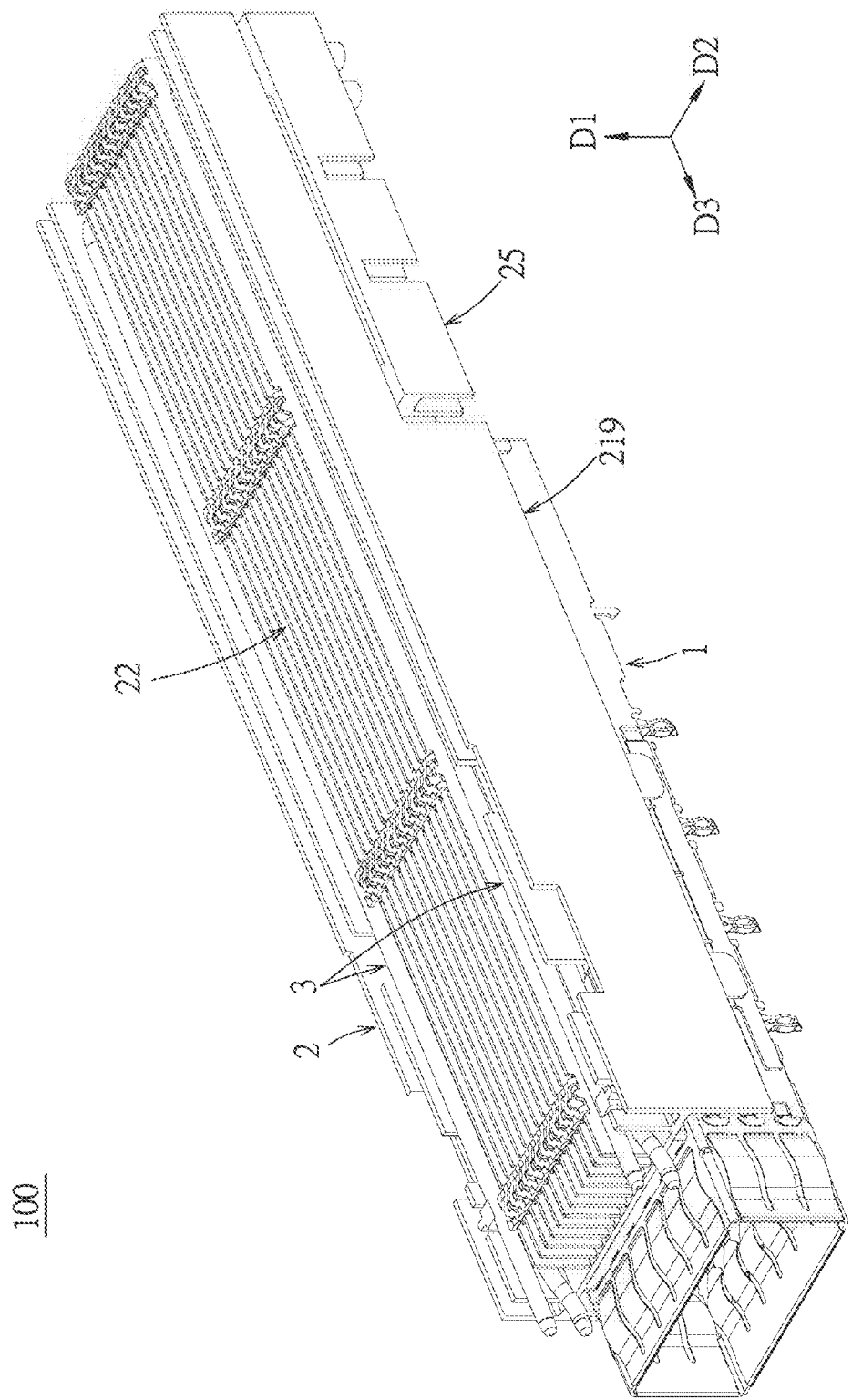
FIG. 23 is a perspective view of a sixth embodiment of the shield cage assembly of the present disclosure.
Figure 24:
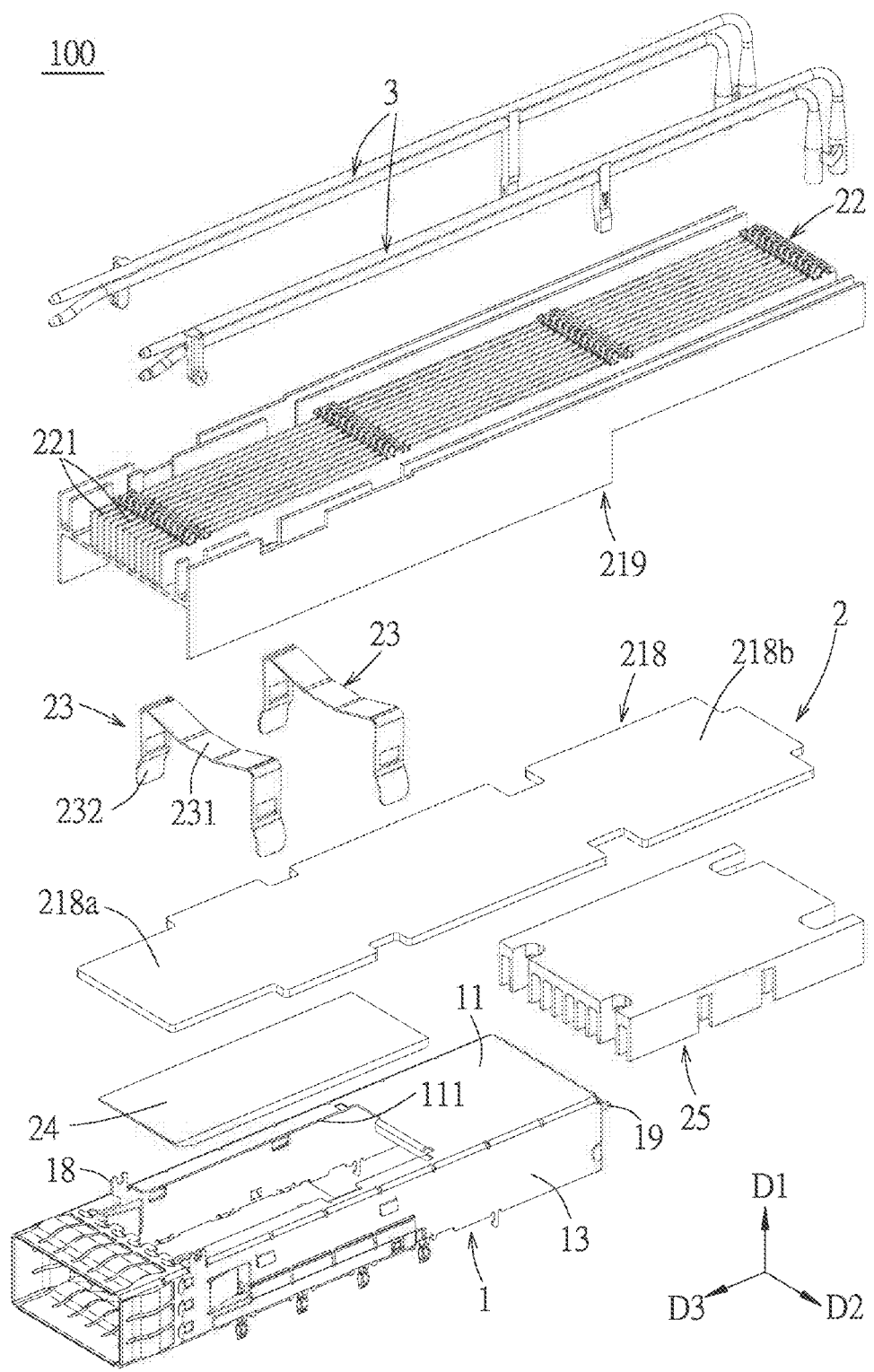
FIG. 24 is an exploded perspective view of the sixth embodiment.
Figure 25:
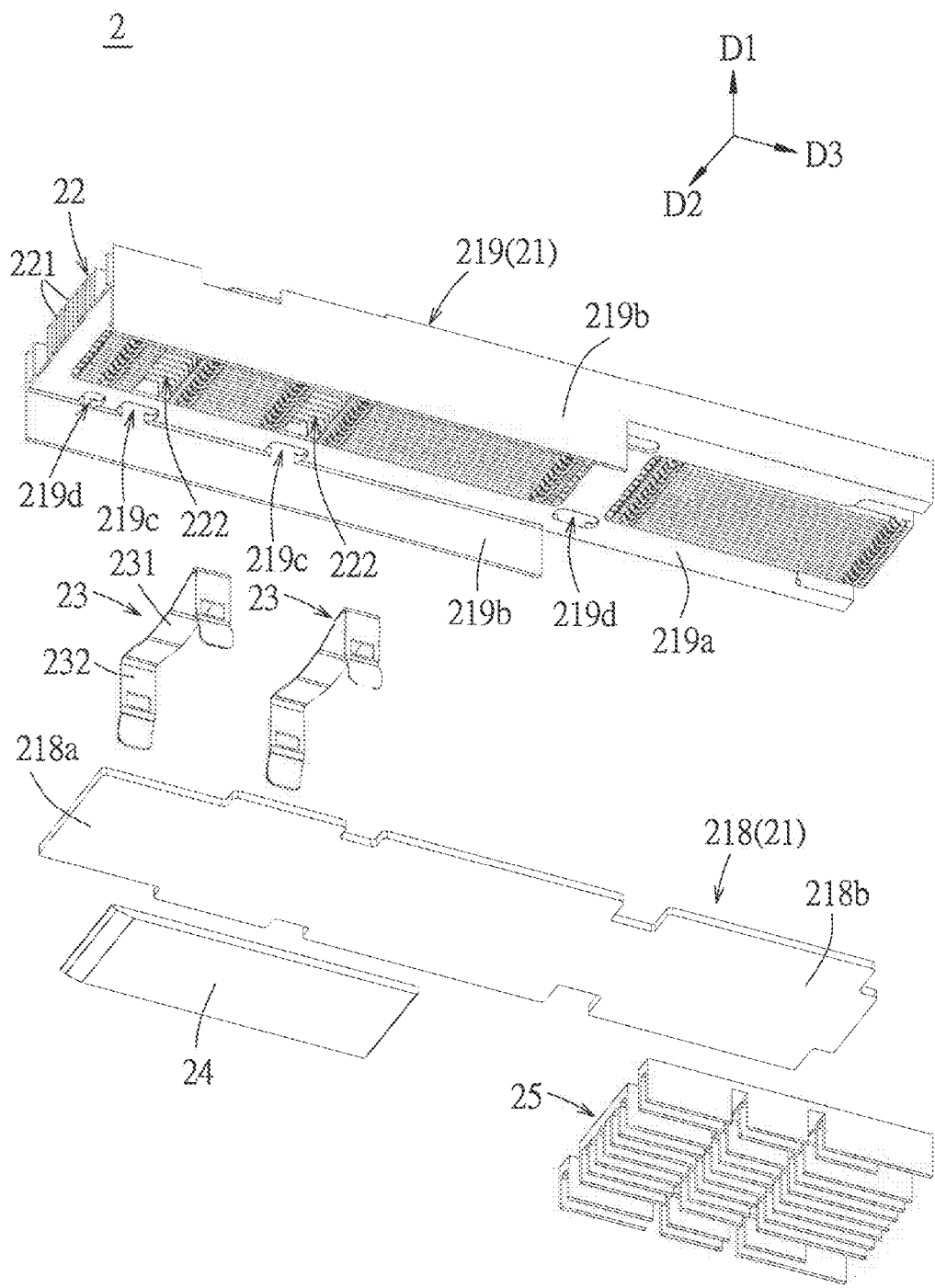
FIG. 25 is an exploded perspective view of the sixth embodiment viewed from another angle and illustrating the heat dissipating module of the sixth embodiment.
Figure 26:
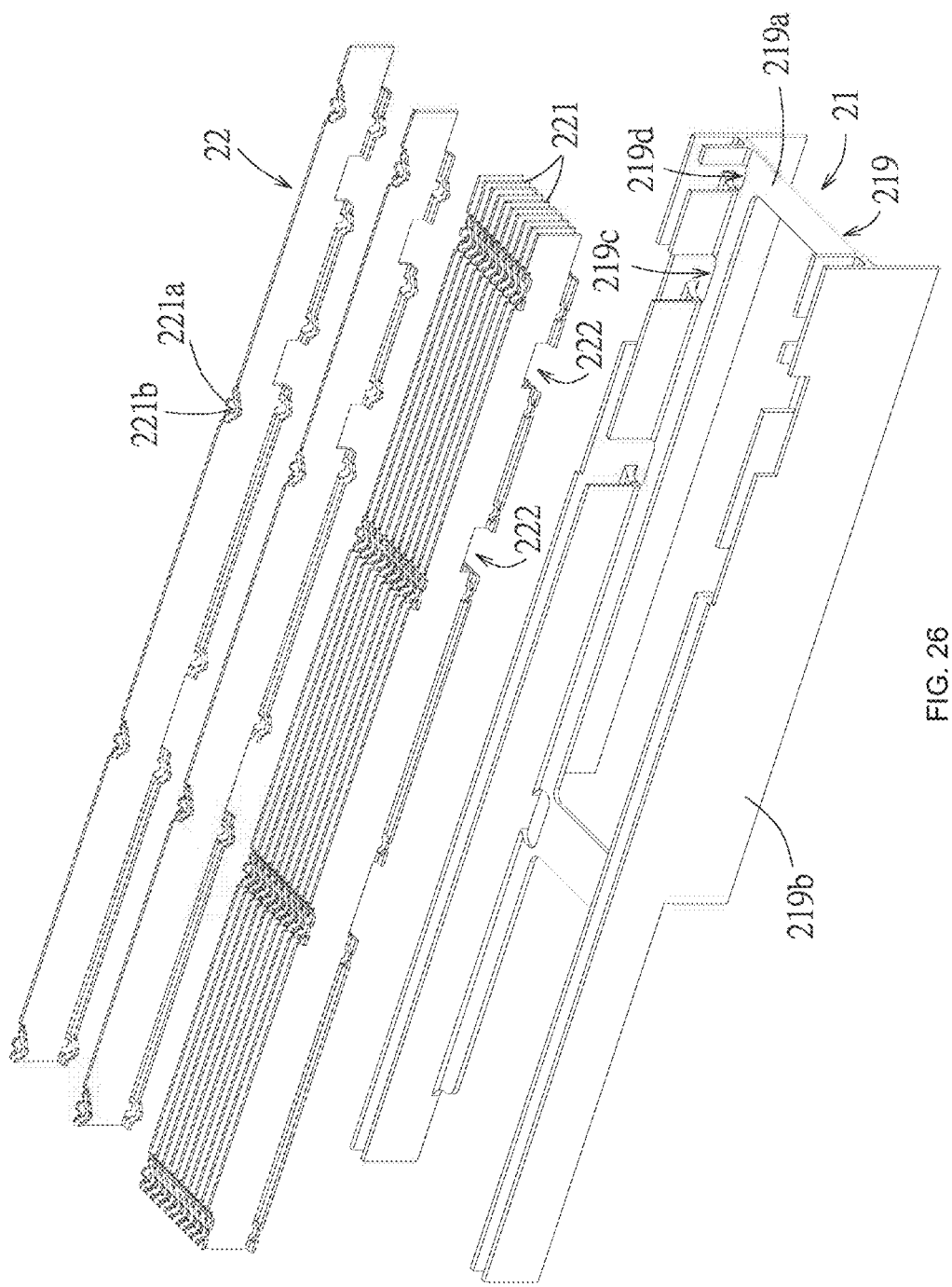
FIG. 26 is an exploded perspective view illustrating a frame of the heat dissipating base member and the first heat dissipating member of the sixth embodiment.

Referring to FIG. 21 and FIG. 22, the difference between a fifth embodiment of the shield cage assembly 100 of the present disclosure and the fourth embodiment lies in that, each second mounting piece 19 of the metal shield shell 1 is formed as a rectangular strip shape and formed with a mortise 191, the mounting segment 333 of the second mounting column 33 of each light guide member 3 has a tenon 334 which correspondingly joints the mortise 191 so as to mount the second mounting column 33 of the light guide member 3 on the second mounting piece 19 of the metal shield shell 1.

Referring to FIG. 23 to FIG. 26, the difference between a sixth embodiment of the shield cage assembly 100 of the present disclosure and the third embodiment lies in that, the heat dissipating base member 21 comprise a thermal plate 218 which covers the top wall 11 and a frame 219 which is provided to the thermal plate 218 and integrally formed by aluminum extrusion, the frame 219 has a frame body 219a which is provided to the top surface of the thermal plate 218 and formed at a central portion thereof to allow the first heat dissipating member 22 to pass through and connect the thermal plate 218 of the heat dissipating base member 21, two side plates 219b which extend from two side edges of the frame body 219a, are parallel to the two side walls 13 and adjacent to outer sides of the two side walls 13, four penetrating holes 219c which are formed to the frame body 219a and respectively p allow the engaging segments 232 of the two clips 23 to pass through downwardly, and four through holes 219d which are formed to the frame body 219a and respectively allow the two first mounting pieces 18 and the two second mounting columns 33 to pass through. The first heat dissipating member 22 is substantially the same as that of the first embodiment, the first heat dissipating member 22 has a plurality of heat dissipating fins 221 substantially formed as a plate shape, are parallel to each other and latch to each other, and a bottom of the first heat dissipating member 22 is formed with two bottom recessed grooves 222 which correspondingly accommodate the retaining segments 231 of the two clips 23 and limit the retaining segments 231 of the two clips 23 in position. More specifically, in the sixth embodiment, the frame body 219a of the frame 219 is provided to the top surface of the thermal plate 218 by welding, and the lower edge of each heat dissipating fin 221 of the first heat dissipating member 22 is also provided to the top surface of the thermal plate 218 of the heat dissipating base member 21 by welding.

Figure 27:
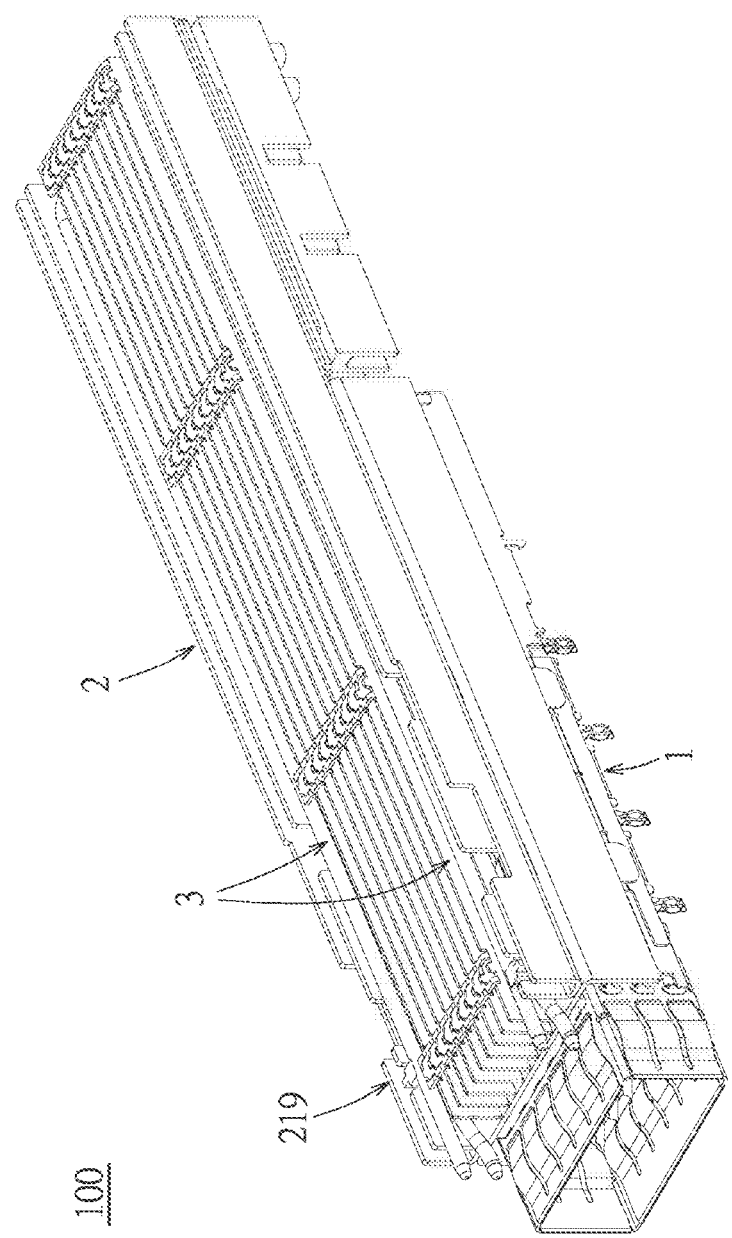
FIG. 27 is a perspective view of a seventh embodiment of the shield cage assembly of the present disclosure.
Figure 28:
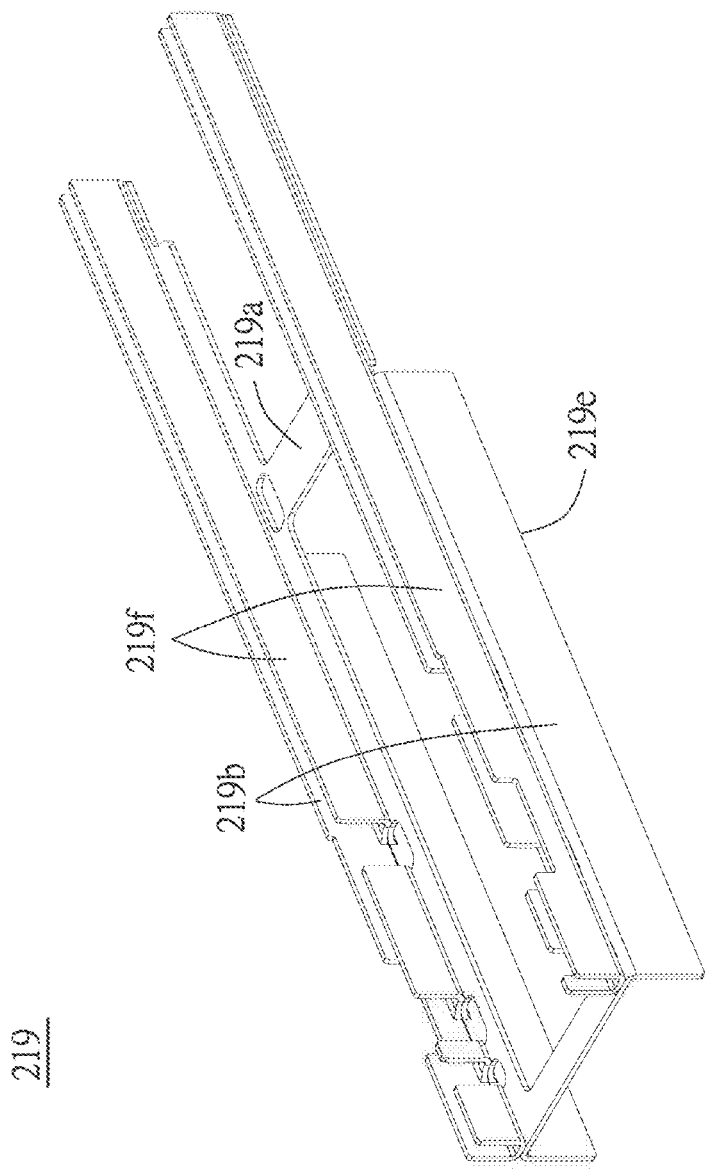
FIG. 28 is a perspective view illustrating the frame of the heat dissipating base member of the seventh embodiment.
Figure 29:
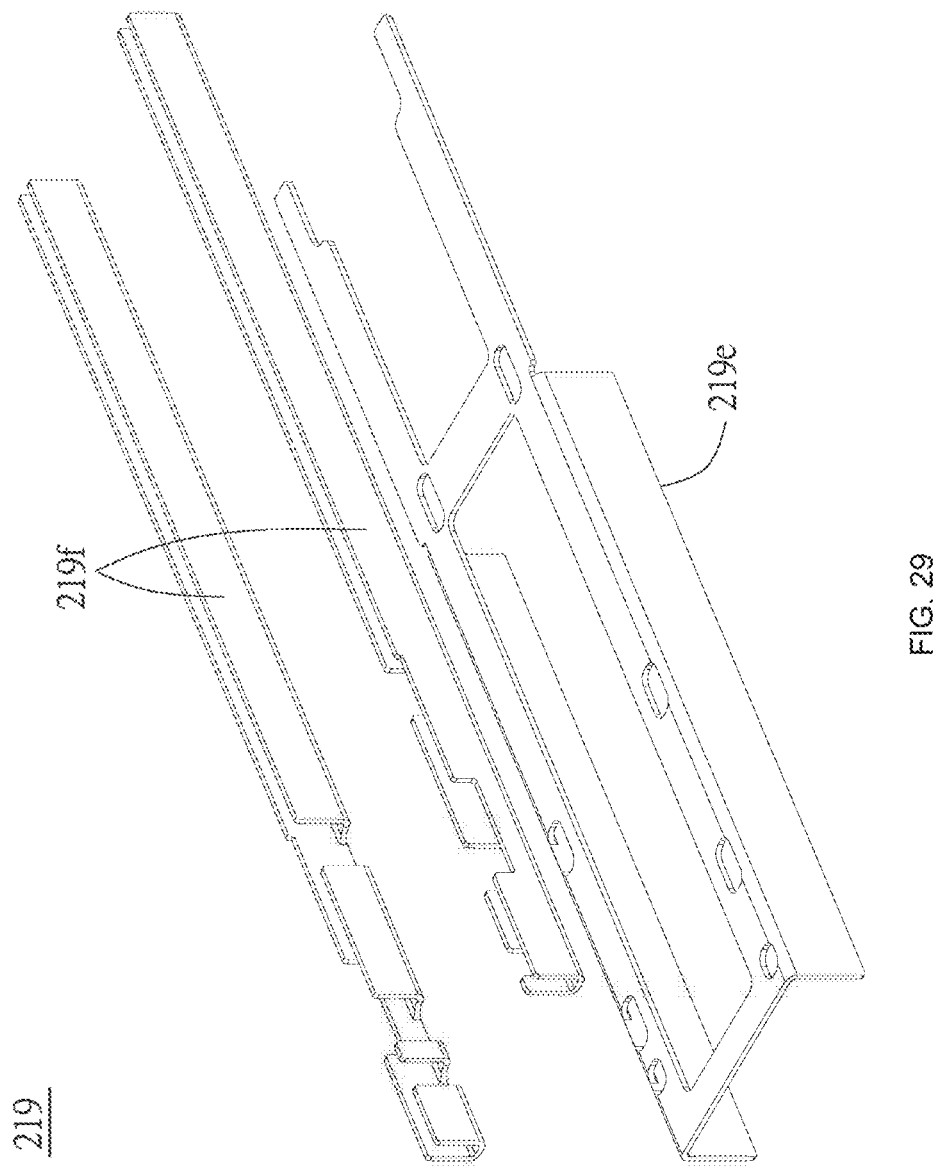
FIG. 29 is an exploded perspective view of FIG. 28.

Referring to FIG. 27 to FIG. 29, the difference between a seventh embodiment of the shield cage assembly 100 of the present disclosure and the sixth embodiment lies in that, the frame 219 is combined-type, and the frame 219 has a main frame member 219e and two sub-frame members 219f provided to the main frame member 219e, the main frame member 219e and the two sub-frame member 219f together constitute the frame body 219a and the two side plate 219b. In the seventh embodiment, the main frame member 219e and the two sub-frame members 219f each are formed by bending a copper plate, and in other embodiments, the main frame member 219e and the two sub-frame members 219f each may be also formed by bending other metal plate, and it is not limited thereto. In addition, the main frame member 219e and the two sub-frame members 219f are connected to each other by welding, and in other embodiments, the main frame member 219e and the two sub-frame members 219f may be also connected to each other by other means, such as an adhesive having a heat conductive effect or a cooperatively assembling structure.

Figure 31:
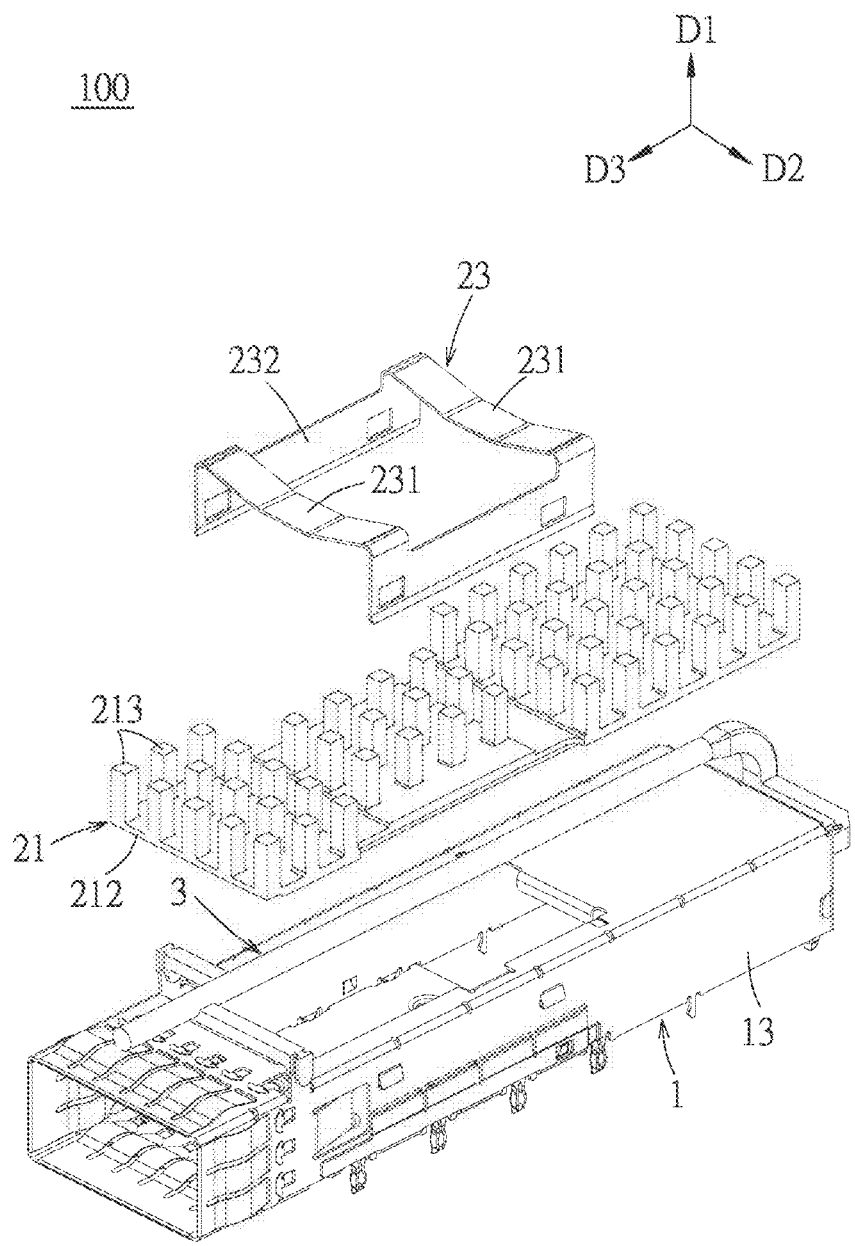
FIG. 31 is an exploded perspective view of the eighth embodiment.
Figure 32:
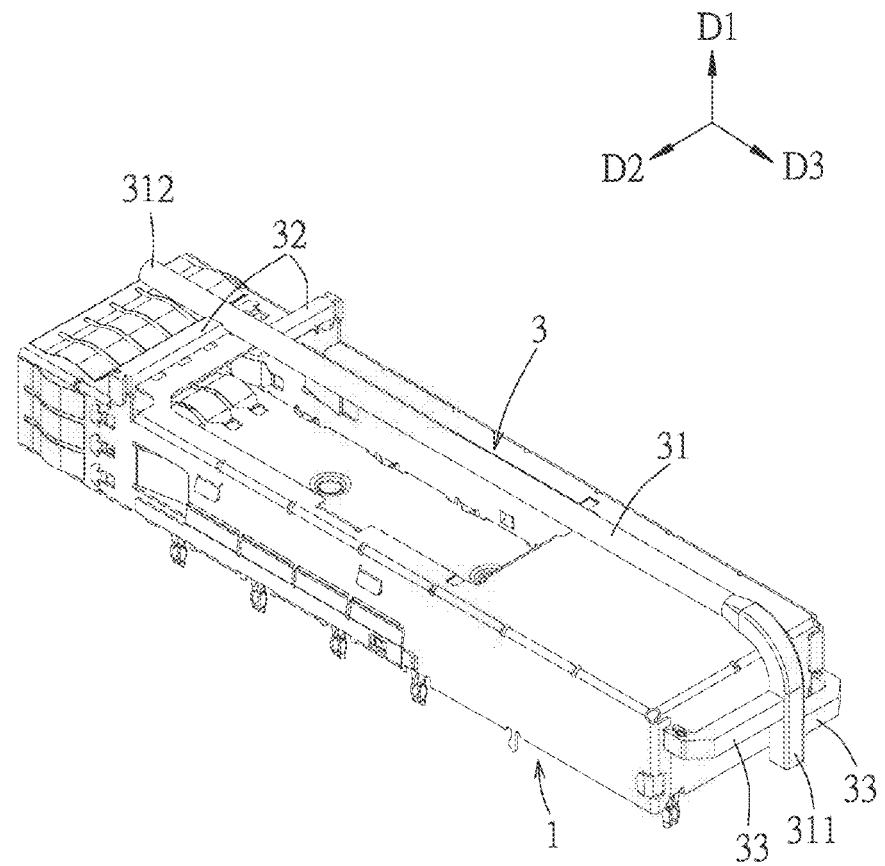
FIG. 32 is a perspective view of the eighth embodiment from another angle with the heat dissipating module of the eighth embodiment omitted.
Figure 33:
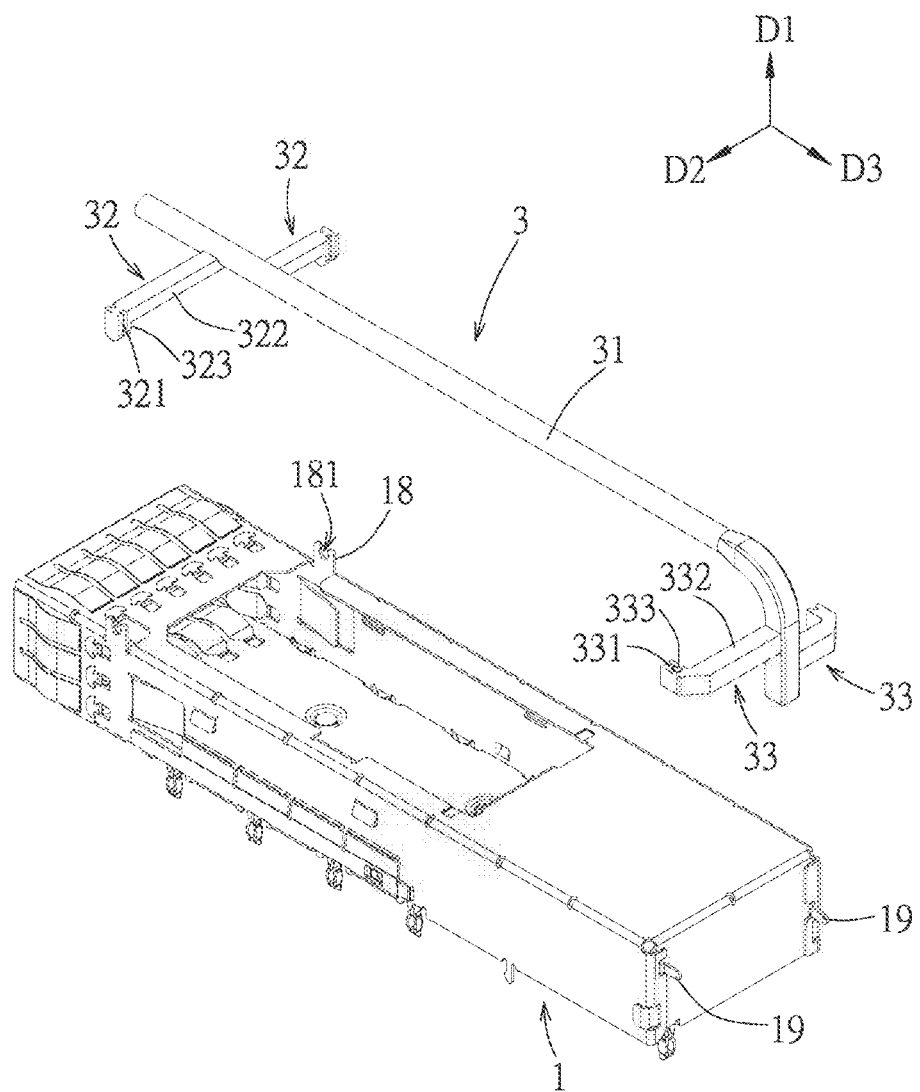
FIG. 33 is an exploded perspective view of FIG. 32.
Figure 34:
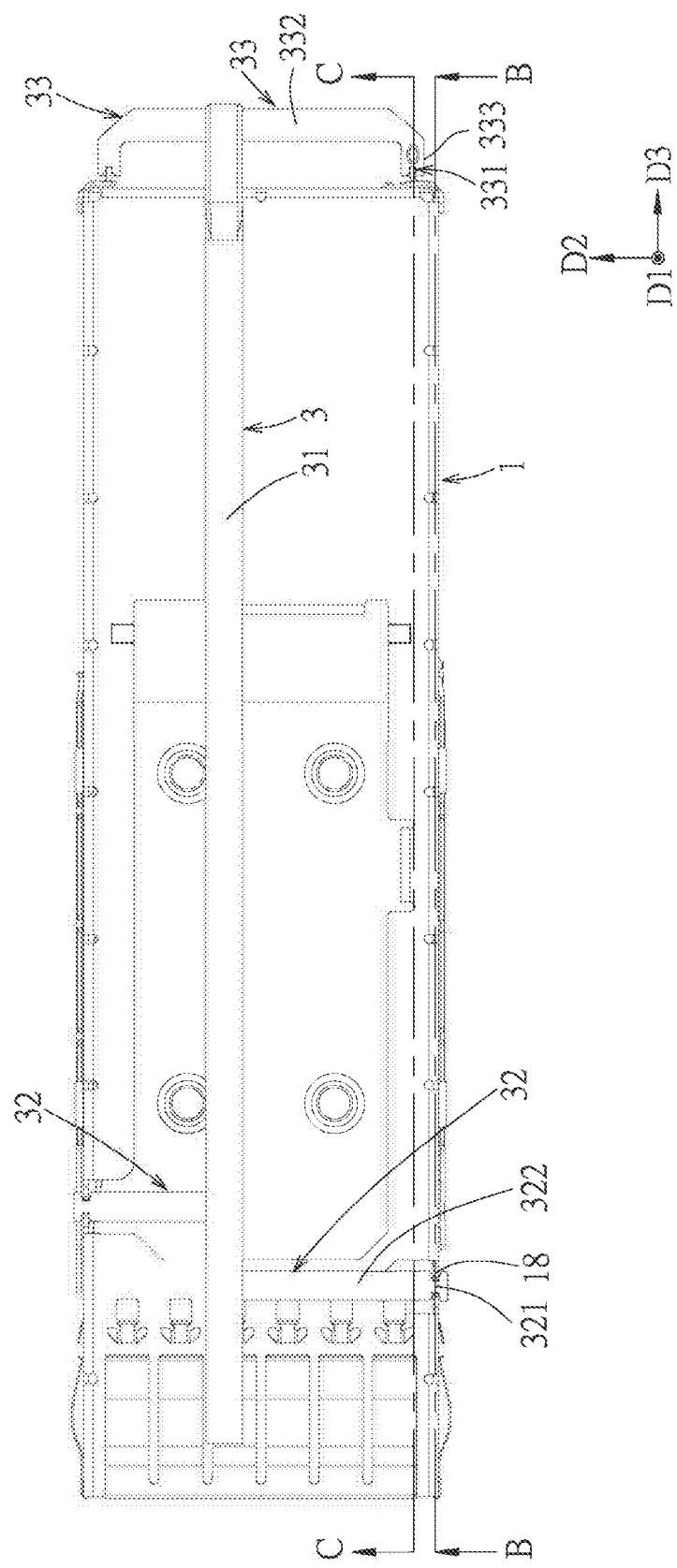
FIG. 34 is a top view of the FIG. 32.
Figure 35:
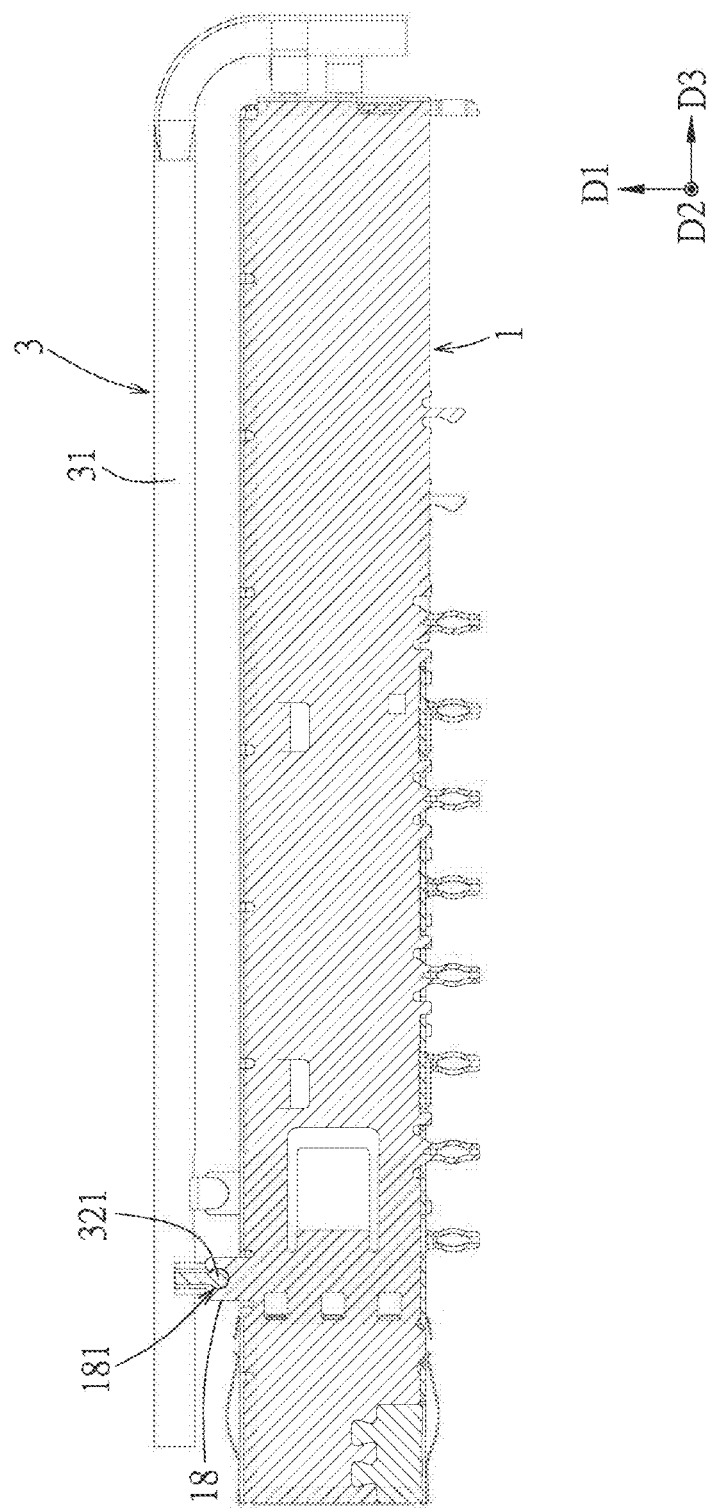
FIG. 35 is a cross sectional view taken along a B-B line of FIG. 34.
Figure 36:
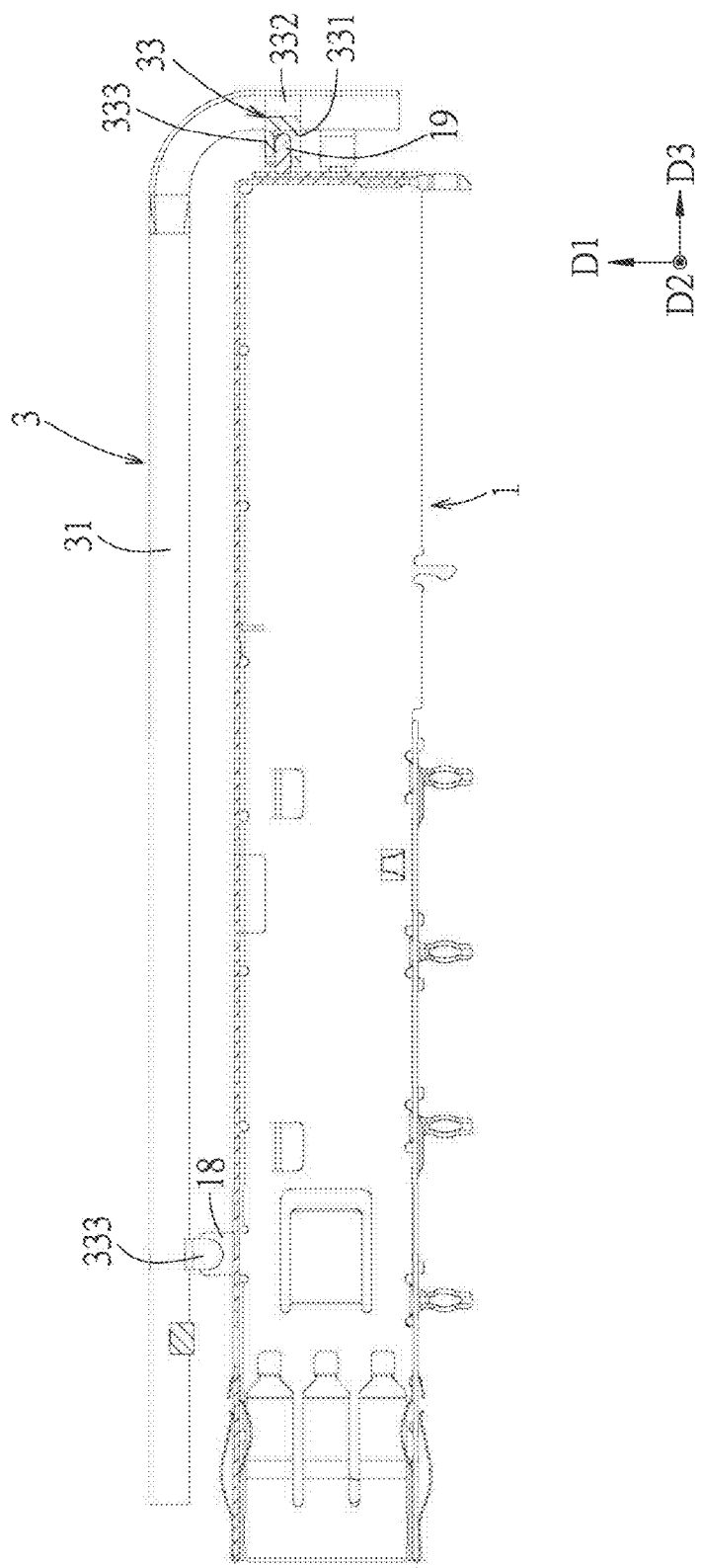
FIG. 36 is a cross sectional view taken along a C-C line of FIG. 34.

FIG. 30 to FIG. 36 illustrate an eighth embodiment of the shield cage assembly 100 of the present disclosure, referring to FIG. 30 and FIG. 31, the heat dissipating module 2 has a heat dissipating base member 21 and a clip 23 fixing the heat dissipating base member 21 to the metal shield shell 1, the heat dissipating fins 213 of the heat dissipating base member 21 are column-shaped fins and extend upwardly from the plate body 212 in an uniform distribution manner, the retaining segment 231 of the clip 23 spans multiple heat dissipating fins 213 in the left-right direction D2.

Referring to FIG. 32 to FIG. 36, in addition, the shield cage assembly 100 has only one light guide member 3, and the light guide member 3 has a light pipe 31 which extends in the front-rear direction D3 and positioned between the heat dissipating fins 213, two first mounting columns 32 which are connected to two sides of a portion of the light pipe 31 close to the light-exit end 312 and respectively mounted to the two first mounting pieces 18, and two second mounting columns 33 which are connected to two sides of a portion of the light pipe 31 close to the light-enter end 311 and respectively provided to the two second mounting pieces 19, and each first mounting column 32 further has an extending segment 322 which extends in the left-right direction D2 and is connected between one side of the light pipe 31 and the mounting segment 323, each second mounting column 33 further has an extending segment 332 which extends in the left-right direction D2 and is connected between one side of the light pipe 31 and a mounting segment 333, and the mounting segment 333 of the second mounting column 33 extends forwardly from a distal end of the extending segment 332, and the extending segment 322 of the first mounting column 32 extend through between the heat dissipating fins 213 (as shown in FIG. 30).

Figure 37:
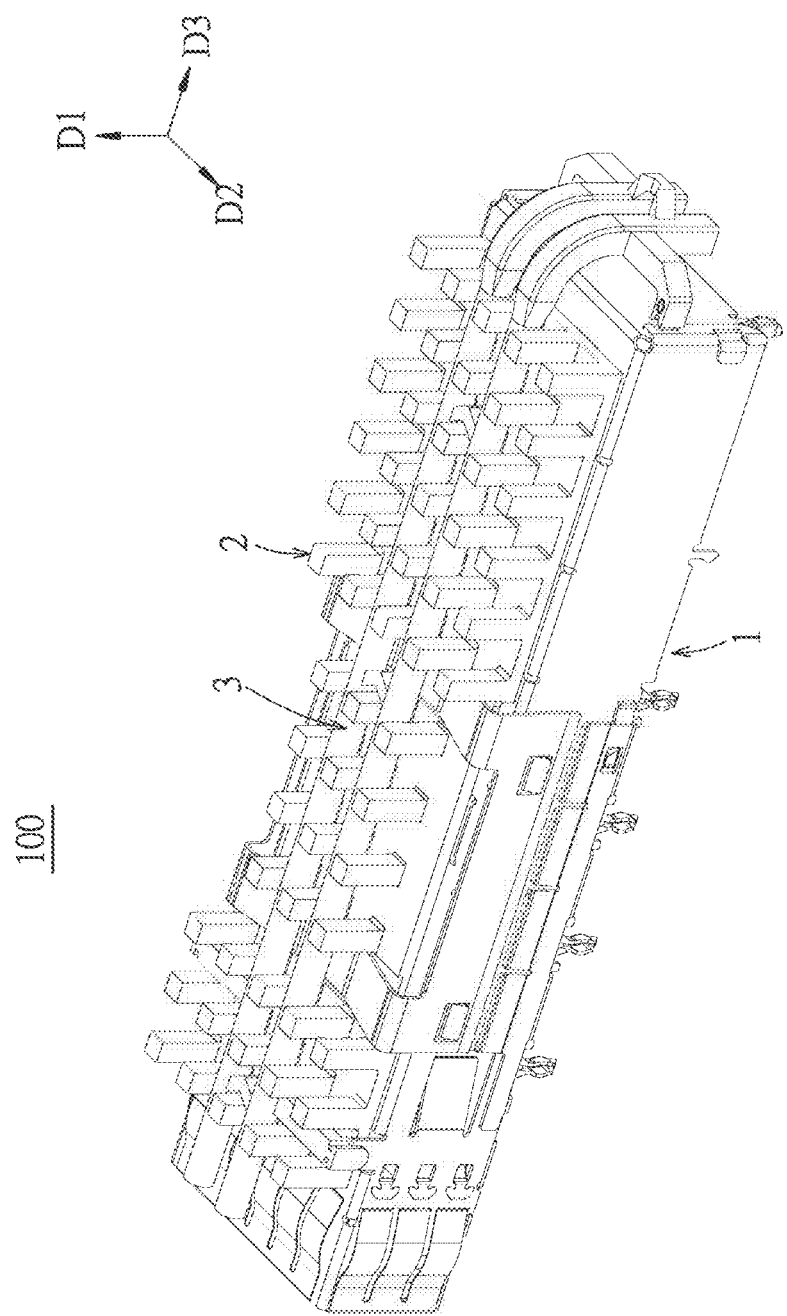
FIG. 37 is a perspective view of a ninth embodiment of the shield cage assembly of the present disclosure.
Figure 38:
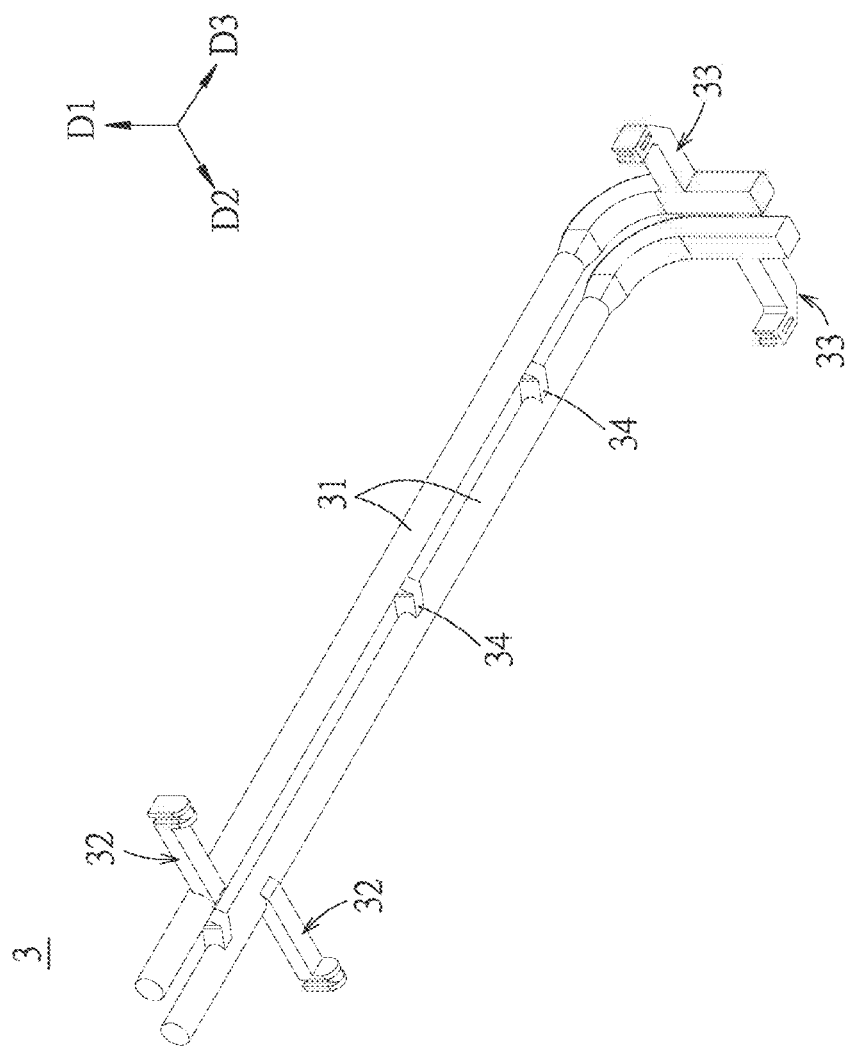
FIG. 38 is a perspective view of a light guide member of the ninth embodiment.

Referring to FIG. 37 and FIG. 38, the difference between a ninth embodiment of the shield cage assembly 100 of the present disclosure and the eighth embodiment lies in that, the light guide member 3 has two light pipes 31 arranged side by side in the left-right direction D2, and the light guide member 3 further has a plurality of connecting columns 34 connected between the two light pipes 31. In addition, the two first mounting columns 32 and the two second mounting columns 33 respectively extend from the two light pipes 31.

Figure 39:
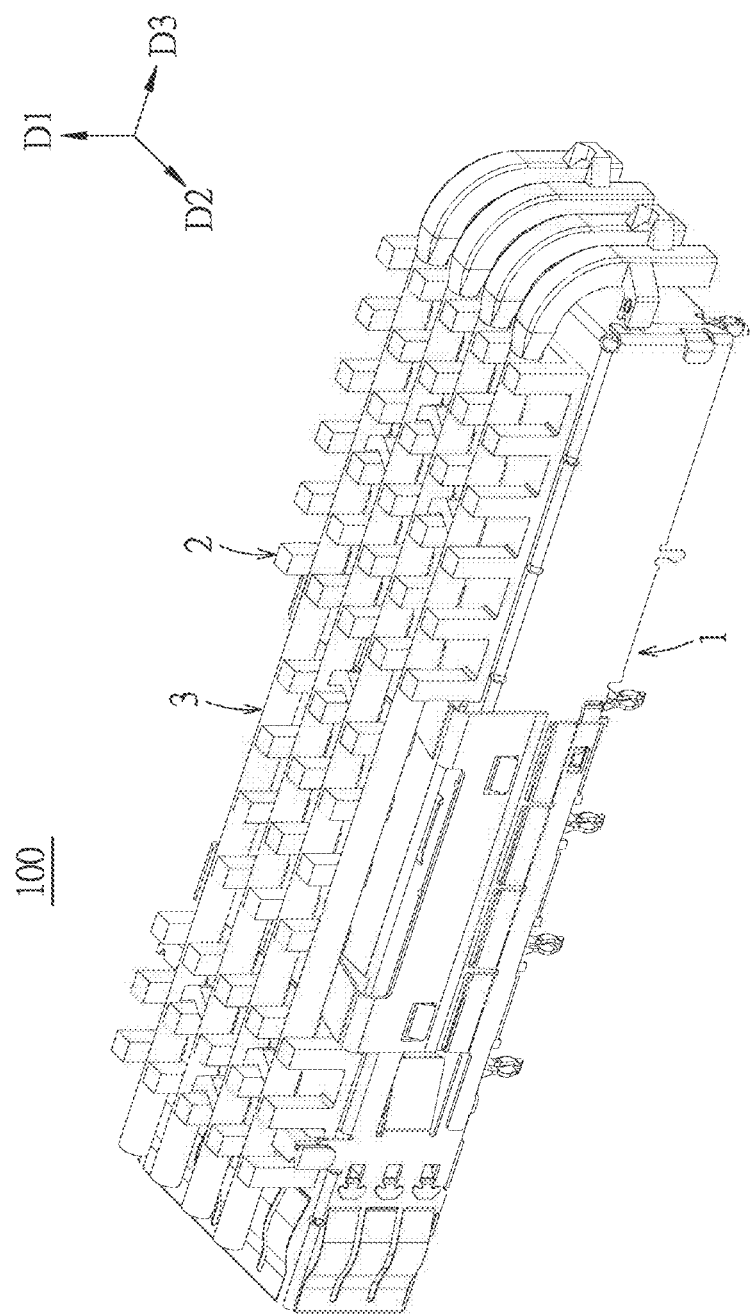
FIG. 39 is a perspective view of a tenth embodiment of the shield cage assembly of the present disclosure.
Figure 40:
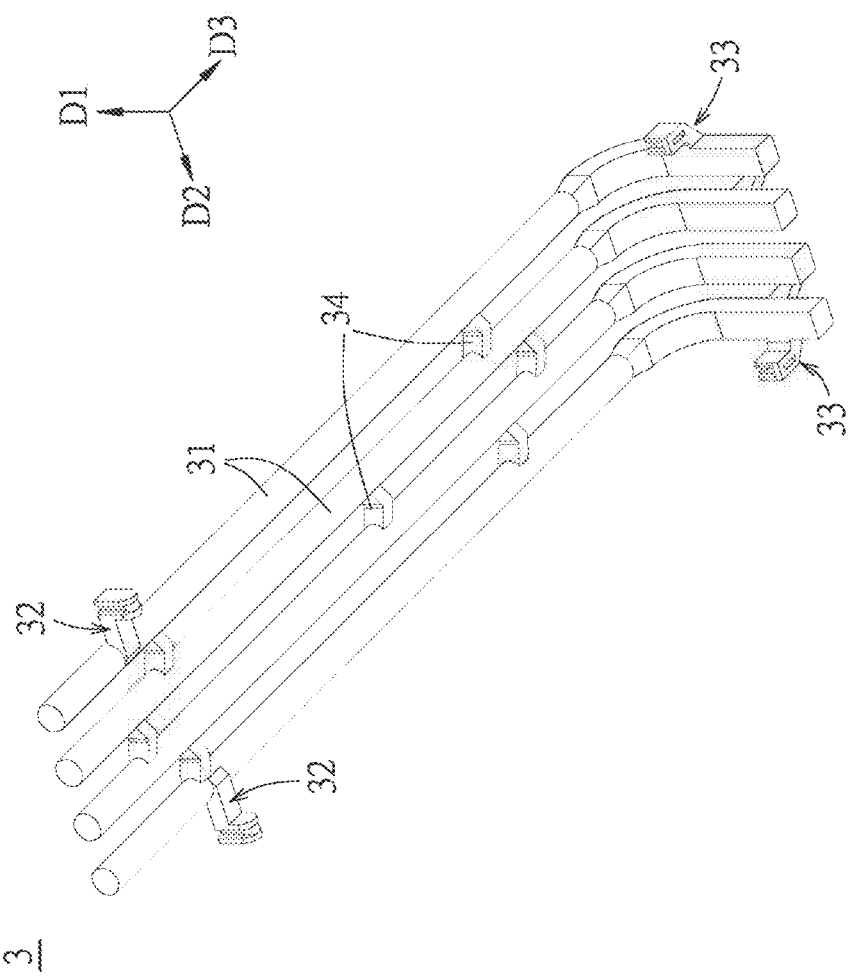
FIG. 40 is a perspective view of the light guide member of the tenth embodiment.

Referring to FIG. 39 and FIG. 40, the difference between a tenth embodiment of the shield cage assembly 100 of the present disclosure and the eighth embodiment lies in that, the light guide member 3 has four light pipes 31 arranged side by side in the left-right direction D2, and the light guide member 3 further has connecting columns 34 connected between every two light pipes 31. In addition, the two first mounting columns 32 and the two second mounting columns 33 respectively extend from the two light pipes 31 positioned at outer sides of the four light pipes 31.

In conclusion, the heat dissipating module 2 of the shield cage assembly 100 of the present disclosure has the clip 23 used for engaging with the metal shield shell 1, so that the assembling of the heat dissipating module 2 and the metal shield shell 1 is more convenient and fast. In addition, by the first segment 218a of the thermal plate 218 and the second segment 218b of the thermal plate 218 extending rearwardly to behind the metal shield shell 1, the size of the first heat dissipating member 22 provided to the thermal plate 218 can be increased, the bottom surface of the second segment 218b of the thermal plate 218 can mount the second heat dissipating member 25, and the heat can rapidly conducted to the first heat dissipating member 22 and the second heat dissipating member 25 which are positioned within the region outside the heat source via the thermal plate 218, thereby increasing the heat dissipating efficiency. Moreover, the piece surface directions of the first mounting pieces 18 are parallel to the front-rear direction D3 and the first mounting pieces 18 are positioned at the two sides of the opening 111, the resistance of the air flow flowing in the front-rear direction D3 is reduced and the heat dissipating efficiency is improved. Also, the second mounting piece 19 is integrally extending rearwardly from the metal shield shell 1 allows the light guide member 3 to be mounted, there is no need to open a hole on the rear end face 141 of the metal shield shell 1, so as to maintain the electromagnetic shielding effect of the metal shield shell 1. Therefore, the object of the present disclosure can be achieved.

However, the above description is only for the embodiments of the present disclosure, and it is not intended to limit the implementing scope of the present disclosure, and the equivalent changes and modifications made according to the claims and the contents of the specification are still included in the scope of the present disclosure.

What is claimed is:
1. A shield cage assembly, comprising:
a metal shield shell comprising a plurality of walls and an accommodating space defined by the plurality of walls and extending in a front-rear direction, the accommodating space comprising a front-end port facing a forward direction; and
a heat dissipating module assembled to a top wall of the plurality of walls of the metal shield shell,
the metal shield shell comprising side walls respectively positioned at two sides of the top wall,
the heat dissipating module comprising a frame and a first heat dissipating member, the frame comprising a frame body formed at a central portion of the frame and two side plates which extend from two side edges of the frame body parallel to and outside the side walls of the metal shield shell.
2. The shield cage assembly of claim 1, wherein the heat dissipating member comprises a plurality of heat dissipating fins that have a plate shape and extend in the front-rear direction.
3. The shield cage assembly of claim 2, wherein the plurality of heat dissipating fins are arranged in a mutually parallel manner.
4. The shield cage assembly of claim 2, wherein the heat dissipating module comprises a thermal plate and the frame body is provided to a top surface of the thermal plate.
5. The shield cage assembly of claim 1, wherein the heat dissipating member comprises a plurality of heat dissipating fins which are integrally formed, extend from a top surface of the frame, and extend in the front-rear direction.

6. The shield cage assembly of claim 5, wherein the heat dissipating module comprises a thermal plate and the frame body is provided to the top surface of the thermal plate.

7. The shield cage assembly of claim 1, wherein the heat dissipating module comprises a thermal plate and the frame body is provided to a top surface of the thermal plate.

8. The shield cage assembly of claim 1, wherein the frame is integrally formed by aluminum extrusion.

9. The shield cage assembly of claim 1, wherein the frame has a main frame member and two sub-frame members provided to the main frame member, the main frame member and the two sub-frame members together constitute the frame body and the two side plates.

10. The shield cage assembly of claim 1, further comprising:
a thermal plate extending over the top wall of the metal shield shell between the heat dissipating module and the metal shield shell and behind a rear edge of the top wall; and
a second heat dissipating member positioned under a bottom surface of the thermal plate behind the rear edge of the top wall of the metal shield shell.

11. The shield cage assembly of claim 1, wherein the frame body comprises a recessed groove and the shield cage assembly further comprises a clip positioned within the recessed groove and between the two side plates of the frame body.

12. The shield cage assembly of claim 1, further comprising:
a thermal plate; and
a heat source contact plate, the thermal plate positioned between the frame body and the heat source contact plate, and the heat source contact plate positioned between the thermal plate and the metal shield shell.

13. The shield cage assembly of claim 1, wherein the heat dissipating member comprises a plurality of heat dissipating fins that extend in the front-rear direction and a grove among the plurality of heat dissipating fins to accommodate a light pipe.

14. The shield cage assembly of claim 1, wherein the heat dissipating member comprises a plurality of heat dissipating fins and a grove among the plurality of heat dissipating fins to accommodate a light pipe.

15. A shield cage assembly, comprising:
a metal shield shell comprising a plurality of walls and a front-end port, the plurality of walls comprising side walls; and
a heat dissipating module comprising a frame and a heat dissipating member, the frame comprising a frame body and two side plates which extend from two side edges of the frame body parallel to and outside the side walls of the metal shield shell.

16. The shield cage assembly of claim 15, further comprising:
a thermal plate extending over a top wall of the metal shield shell between the heat dissipating module and the metal shield shell and behind a rear edge of the top wall; and
a second heat dissipating member positioned under a top surface of the thermal plate behind the rear edge of the top wall of the metal shield shell.

17. The shield cage assembly of claim 15, wherein the frame body comprises a recessed groove and the shield cage assembly further comprises a clip positioned within the recessed groove and between the two side plates of the frame body.

18. The shield cage assembly of claim 15, further comprising:
a thermal plate; and
a heat source contact plate, the thermal plate positioned between the frame body and the heat source contact plate, and the heat source contact plate positioned between the thermal plate and the metal shield shell.

19. A heat dissipating module, comprising:
a thermal plate;
a frame positioned over a top surface of the thermal plate, the frame comprising a frame body and two side plates which extend from two side edges of the frame body;
a first heat dissipating member comprising a first plurality of heat dissipating fins extending upwardly;
a second heat dissipating member positioned under a bottom surface of the thermal plate, the second heat dissipating member comprising a second plurality of heat dissipating fins extending downwardly.

20. The heat dissipating module of claim 19, wherein the first heat dissipating member further comprises a grove among the first plurality of heat dissipating fins to accommodate a light pipe.

* * * * *